US012652017B2

(12) United States Patent
Kadota et al.

(10) Patent No.: US 12,652,017 B2
(45) Date of Patent: Jun. 9, 2026

(54) ELASTIC WAVE DEVICE

(71) Applicant: Murata Manufacturing Co., Ltd., Nagaokakyo (JP)

(72) Inventors: Michio Kadota, Sendai (JP); Shuji Tanaka, Sendai (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1059 days.

(21) Appl. No.: 17/633,432

(22) PCT Filed: Aug. 4, 2020

(86) PCT No.: PCT/JP2020/029759
§ 371 (c)(1),
(2) Date: Feb. 7, 2022

(87) PCT Pub. No.: WO2021/025004
PCT Pub. Date: Feb. 11, 2021

(65) Prior Publication Data
US 2022/0294415 A1 Sep. 15, 2022

(30) Foreign Application Priority Data
Aug. 8, 2019 (JP) ................................ 2019-145908

(51) Int. Cl.
*H03H 9/17* (2006.01)
*H03H 9/02* (2006.01)
(Continued)

(52) U.S. Cl.
CPC ........ *H03H 9/171* (2013.01); *H03H 9/02031* (2013.01); *H03H 9/13* (2013.01); *H03H 9/542* (2013.01)

(58) Field of Classification Search
CPC .......... H03H 9/17; H03H 9/171; H03H 9/175; H03H 9/567; H03H 9/564; H03H 9/542;
(Continued)

(56) References Cited

U.S. PATENT DOCUMENTS

| | | | |
|---|---|---|---|
| 2004/0024644 A1* | 2/2004 | Gui ...................... | G06Q 20/203 705/28 |
| 2005/0023932 A1* | 2/2005 | Inoue ..................... | H03H 9/174 310/327 |

(Continued)

FOREIGN PATENT DOCUMENTS

| | | |
|---|---|---|
| JP | H09-162683 A | 6/1997 |
| JP | 2005-51447 A | 2/2005 |

(Continued)

OTHER PUBLICATIONS

Larson III et al.; "Power Handling and Temperature Coefficient Studies in FBAR Duplexers for the 1900 MHz PCS Band", IEEE Ultrasononics Symposium; 2000; pp. 869-874.
(Continued)

*Primary Examiner* — J. San Martin
(74) *Attorney, Agent, or Firm* — Keating & Bennett, LLP

(57) ABSTRACT

An elastic wave device capable of obtaining good characteristics while maintaining sufficient mechanical strength in an ultra-high frequency band of 6 GHz or higher includes: a piezoelectric substrate; an electrode in contact with the piezoelectric substrate; and an acoustic multilayer film in contact with the piezoelectric substrate and/or the electrode. The elastic wave device is configured to utilize higher-order modes of resonance characteristics of bulk waves. The acoustic multilayer film has a low acoustic impedance film and a high acoustic impedance film which are alternately stacked.

21 Claims, 17 Drawing Sheets

(51) Int. Cl.
*H03H 9/13*      (2006.01)
*H03H 9/54*      (2006.01)

(58) Field of Classification Search
CPC .. H03H 9/13; H03H 9/02062; H03H 9/02015;
                                  H03H 9/02031
See application file for complete search history.

(56)             References Cited

U.S. PATENT DOCUMENTS

| | | | | |
|---|---|---|---|---|
| 2012/0286900 | A1 * | 11/2012 | Kadota | H03H 9/542 |
| | | | | 333/195 |
| 2013/0057360 | A1 * | 3/2013 | Meltaus | H03H 9/205 |
| | | | | 29/25.35 |
| 2023/0361752 | A1 * | 11/2023 | Kadota | H03H 9/145 |
| 2025/0158594 | A1 * | 5/2025 | Yantchev | H03H 9/175 |

FOREIGN PATENT DOCUMENTS

| | | | | | |
|---|---|---|---|---|---|
| JP | 2005318547 | A | * | 11/2005 | |
| JP | 2007-36915 | A | | 2/2007 | |
| JP | 2013-528996 | A | | 7/2013 | |
| JP | 2013-225945 | A | | 10/2013 | |
| JP | 2015-502065 | A | | 1/2015 | |
| JP | 2018-110317 | A | | 7/2018 | |
| WO | 2013/031748 | A1 | | 3/2013 | |
| WO | WO-2024001757 | A1 | * | 1/2024 | ......... H03H 9/02015 |

OTHER PUBLICATIONS

Umeda et al.;"Piezoelectric Properties Of ScAlN Thin Films for Piezo-Mems Devices;" Proc. MEMS (Taipei, Taiwan); 2013; pp. 733-736.

Tai et al.; "Single Crystal FBAR with LiNbO3 and LiTaO3;" Proceeding of Symposium on Ultrasonic Electronics,; 2007; pp. 151-152; vol. 28.

Yokoyama et al.; "Highly Piezoelectric Co-Doped AlN Thin Films for Wideband FBAR Applications;" IEEE Transactions on Ultrasonics, Ferroelectrics, & Frequency Control; 2015; pp. 1007-1015; vol. 62, No. 6.

Nishihara et al.;"High Performance and Miniature Thin Film Bulk Acoustic Wave Filters for 5 GHz;" 2002 IEEE Ultrasonics Symposium; pp. 969-972.

Kobayashi et al.; "Fabrication of Piezoelectric Thin Film Resonators with Acoustic Quarter-Wave Multilayers;" Japan, J. Appl. Phys.; 2002; pp. 3455-3457; vol. 40.

Oct. 20, 2020 Search Report issued in International Patent Application No. PCT/JP2020/029759.

Oct. 20, 2020 Written Opinion of the International Searching Authority issued in International Patent Application No. PCT/JP2020/029759.

* cited by examiner (a)

(b)

（a）

$\theta$ at $(0°, \theta, \psi)$ LiNbO$_3$

（b）

$\theta$ at $(0°, \theta, \psi)$ LiNbO$_3$ (a)

(b)

(c)

Average thickness [λ] of each layer of acoustic multilayer film (a)

(b)

(c)

(a)

$\theta$ at $(0°, \theta, 18°)$ LiNbO$_3$ [°]

(b)

Average thickness [ $\lambda$ ] of each layer of acoustic multilayer film (a)

(b)

(c)

(a)

(b)

Average thickness [ λ ] of each layer of acoustic multilayer film (a)

$\theta$ at (0°, $\theta$, $\psi$) LiTaO$_3$ [°]

(b)

Average thickness [$\lambda$] of each layer of acoustic multilayer film (c)

Average thickness [$\lambda$] of each layer of acoustic multilayer film (90,90,φ)LN Sum [ λ ] of average thickness of low acoustic impedance film
and average thickness of high acoustic impedance film (a)

(b)

(a)

Thickness [ λ ] of low acoustic impedance film (b)

Sum [ λ ] of average thickness of low acoustic impedance film
and average thickness of high acoustic impedance film Sum [ λ ] of average thickness of low acoustic impedance film
and average thickness of high acoustic impedance film

ELASTIC WAVE DEVICE

FIELD OF THE INVENTION

The present invention relates to elastic wave devices.

DESCRIPTION OF RELATED ART

In recent years, the frequency band from 700 MHz to 3 GHz, which is mainly used for smartphones and the like, is extremely congested with approximately eighty bands. As a countermeasure, the 5th generation mobile communication system (5G) is planning to use a frequency band from 3.6 GHz to 4.9 GHz, and the next 6th generation is planning to use a frequency band of 6 GHz or higher.

Conventionally, in the frequency band of 700 MHz to 3 GHz, a surface acoustic wave (SAW) device using a LiTaO$_3$ crystal (LT) or a LiNbO$_3$ crystal (LN) as a piezoelectric thin film, and a bulk acoustic wave FBAR (Film Bulk Acoustic Resonator) device is used. However, the frequency f of the SAW device is determined by f=V/pitch, where V is the sound velocity in the substrate and pitch is the period (pitch) of interdigital electrodes. Therefore, due to the limits of sound velocity and pitch, the frequency is limited to 3.5 GHz on the high frequency side.

On the other hand, bulk acoustic wave FBAR devices using piezoelectric thin films include cavity FBARs that require cavities above and below a piezoelectric thin film, and acoustic multilayer FBARs having an acoustic multilayer film and a holding substrate instead of the cavity on one side of the piezoelectric thin film. The cavity FBARs include those using a piezoelectric thin film of AlN or ScAlN (see, for example, Non-Patent Literature 1 or 2) and those using a single crystal thin sheet of LN (see, for example, Non-Patent Literature 3). In the former cavity FBARs, since the AlN and ScAlN films are c-axis oriented, the vibration mode of the bulk waves used is only the thickness longitudinal vibration. The sound velocity of this longitudinal waves is expressed by (c33$^D$/density)$^{1/2}$ (c33$^D$ is an elastic stiffness constant), and the excitation frequency strictly decreases by the mass load of the electrode, but is approximately expressed by (sound velocity)/(2×(film thickness)). Therefore, in order to increase the excitation frequency to a higher frequency, the film thickness of the piezoelectric thin film must be extremely thin. In the cavity FBARs using the single crystal thin sheet of LN, the excitation frequency is inversely proportional to the thickness of the substrate. Therefore, in order to increase the excitation frequency to a higher frequency, the film thickness of the piezoelectric thin film must be extremely thin. In the cavity FBARs described in Non-Patent Literatures 1 to 3, when the film thickness of the piezoelectric thin film is 0.9 to 2 μm, an excitation frequency of about 2 GHz and an impedance ratio of about 60 dB are obtained.

However, among these cavity FBARs, those using AlN or ScAlN as the piezoelectric thin film have a problem that attenuation at ultra-high frequencies is large because they are polycrystalline thin films, and it is difficult to realize good characteristics. For example, in cavity FBARs using AlN, it has been confirmed that an impedance ratio of 70 dB is obtained at 2 GHz, but the impedance ratio decreases to 50 dB at 5 GHz (see, for example, Non-Patent Literature 4 or 5).

As acoustic multilayer FBARs for use at high frequencies, an FBAR having a structure in which a piezoelectric thin film (thickness: t=wavelength/2) made of ZnO, an acoustic multilayer film in which a large number of acoustic films are stacked, and a holding substrate are stacked has been proposed (see, for example, Non-Patent Literature 6). In this elastic wave device, the thickness of each acoustic film is set to half the thickness of the piezoelectric thin film (that is, wavelength/4) in order to increase the excitation in the fundamental mode. In this elastic wave device, the vibration mode of bulk waves is the thickness longitudinal vibration, but an impedance ratio of only 21 dB is obtained at 3 GHz in the fundamental mode in actual measurement, and the characteristics are inferior to the cavity FBARs made of AlN films. Therefore, it has not been put into practical use.

As acoustic multilayer FBARs which can obtain a high resonance frequency, a higher-order mode thin film resonator has been developed (see, for example, Patent Literature 1). In this thin film resonator, a piezoelectric thin film in which a first piezoelectric layer made of either ZnO or AlN and whose (0001) direction is oriented in a first direction substantially parallel to the surface of the piezoelectric thin film and a second piezoelectric layer whose (0001) direction is oriented in a direction 180° different from the first piezoelectric layer are stacked is provided between upper and lower electrodes. According to this resonator, the resonance frequency is doubled as compared with a conventional resonator having the same thickness of the piezoelectric thin film.

CITATION LIST

Non-Patent Literature

Non-Patent Literature 1: John D. Larson III et al., "Power Handling and Temperature Coefficient Studies in FBAR Duplexers for the 1900 MHz PCS Band", Proc. IEEE Ultrason. Symp., 2000, p. 869-874

Non-Patent Literature 2: Keiichi Umeda et al., "PIEZO-ELECTRIC PROPERTIES OF ScAlN THIN FILMS FOR PIEZO-MEMS DEVICES", Proc. MEMS (Taipei, Taiwan), 2013, p. 20-24, Non-Patent Literature 3: Tomoyoshi Tai, three others, "Development of Single Crystal FBAR Using LiNbO$_3$, LiTaO$_3$", Proceeding of Symposium on Ultrasonic Electronics, 2007, Vol. 28, p. 151-152

Non-Patent Literature 4: Tsuyoshi Yokoyama et al., "Highly Piezoelectric Co-Doped AlN Thin Films for Wideband FBAR Applications", IEEE Trans. Ultrason. Ferroelectr. & Freq. Control, June 2015, Vol. 62, No. 6, p. 1007-1015

Non-Patent Literature 5: T. Nishihara et al., "High Performance and Miniature Thin Film Bulk Acoustic Wave Filters for 5 GHz", 2002 IEEE ULTRASONICS SYMPOSIUM, p. 969-972

Non-Patent Literature 6: Hideaki Kobayashi et al., "Fabrication of Piezoelectric Thin Film Resonators with Acoustic Quarter-Wave Multilayers", Japan, J. Appl. Phys., 2002, Vol. 40, p. 3455-3457

PATENT LITERATURE

Patent Literature 1: JP-A-2007-36915

SUMMARY OF THE INVENTION

In the cavity FBARs as described in Non-Patent Literatures 1 and 2 and the acoustic multilayer FBAR described in Non-Patent Literature 6, the impedance ratio decreases to 50 dB at 5 GHz and 3 GHz, respectively. There is a problem that good characteristics of a high impedance ratio are not obtained in an ultra-high frequency band of 6 GHz or higher.

In the cavity FBARs as described in Non-Patent Literatures 1 to 3, since the piezoelectric thin film becomes extremely as thin as 0.3 to 0.6 μm in an ultra-high frequency band of 6 GHz or higher, there is a problem that it is difficult to maintain mechanical strength. In particular, the cavity FBARs described in Non-Patent Literature 3 cannot be put into practical use because the piezoelectric thin film is an LN single crystal thin sheet, so that mechanical strength cannot be obtained as compared with the polycrystalline thin film.

In the higher-order mode thin film resonator described in Patent Literature 1 which is an acoustic multilayer FBAR, the thickness of the piezoelectric thin film is doubled at the same resonance frequency as compared with the cavity FBARs using fundamental waves as described in Non-Patent Literatures 1 to 3. However, the two piezoelectric layers constituting the piezoelectric thin film have the same thickness as the conventional piezoelectric thin film. Therefore, in the ultra-high frequency band of 6 GHz or higher, each piezoelectric layer becomes extremely thin, and there is a problem that it is difficult to maintain these mechanical strengths. In the ultra-high frequency band of 6 GHz or higher, although the thickness of the piezoelectric thin film is doubled, since it is still very thin, there is a problem that it is difficult to maintain the mechanical strength of the piezoelectric thin film itself. Since an impedance ratio of only 12 dB is obtained at a frequency of 560 MHz, and the impedance ratio decreases further at a frequency of 6 GHz, there is a problem that it is difficult to put it into practical use. The acoustic multilayer FBAR as described in Non-Patent Literature 6 and Patent Literature 1 merely uses a polycrystalline piezoelectric thin film, and good characteristics are not realized even in the fundamental mode, and its frequency is 3 GHz or lower.

The present invention has been made in view of such problems, and an object thereof is to provide an elastic wave device capable of obtaining good characteristics while maintaining sufficient mechanical strength in an ultra-high frequency band of 6 GHz or higher.

In order to achieve the above object, an elastic wave device according to the present invention includes: a piezoelectric substrate; an electrode provided in contact with the piezoelectric substrate; and an acoustic multilayer film provided in contact with the piezoelectric substrate and/or the electrode, wherein the elastic wave device is configured to utilize higher-order modes of resonance characteristics of bulk waves.

The elastic wave device according to the present invention can excite higher-order modes (overtone) (primary mode, secondary mode, and the like) having higher frequencies than the fundamental mode (0th-order) using the acoustic multilayer film. By adjusting the type of the piezoelectric substrate and the thickness of each layer of the acoustic multilayer film, it is possible to obtain a higher-order mode having a large impedance ratio. By utilizing this higher-order mode, the elastic wave device according to the present invention can obtain good characteristics having a large impedance ratio in an ultra-high frequency band of 6 GHz or higher. By utilizing the higher-order mode, it is not necessary to make the piezoelectric substrate extremely thin, and cavities are not required above and below the piezoelectric substrate. Thus, sufficient mechanical strength can be maintained even in an ultra-high frequency band of 6 GHz or higher. Here, the impedance ratio is the ratio $[20 \times \log(Za/Zr)]$ of the resonance impedance Zr at the resonance frequency and the antiresonance impedance Za at the antiresonance frequency.

In the elastic wave device according to the present invention, it is preferable that the electrode include two or more electrodes. The electrode may cover the entire surface of one the surfaces of the piezoelectric substrate, or may cover a portion of the piezoelectric substrate. The electrode may have an arbitrary shape such as a circular shape, a polygonal shape, or an elliptical shape. The elastic wave device according to the present invention may have a structure in which electrodes are provided on both sides of the piezoelectric substrate, respectively, and a structure in which two resonators are connected in series, that is, a structure in which a common electrode is provided between the piezoelectric substrate and the acoustic multilayer film and two electrodes are provided on the surface of the piezoelectric substrate opposite to the acoustic multilayer film. A plurality of electrodes may be provided on one or both surfaces of the piezoelectric substrate, and three or more resonators may be formed on the piezoelectric substrate and be connected in series and/or parallel to form a ladder filter or a multi-mode filter. The piezoelectric substrate also includes a piezoelectric thin film and a piezoelectric thin sheet.

In the elastic wave device according to the present invention, it is preferable that the acoustic multilayer film is obtained by alternately stacking a low acoustic impedance film and a high acoustic impedance film. In particular, in the acoustic multilayer film, it is preferable that the low acoustic impedance film and the high acoustic impedance film are alternately and continuously stacked in 3 or more and 20 or less layers. In this case, it is preferable that the thickness of at least three layers of the low acoustic impedance films and the high acoustic impedance films of the acoustic multilayer film is 0.016×wavelength to 0.11×wavelength of that of the bulk waves. It is also preferable that the acoustic impedance film is formed on a layer close to the piezoelectric substrate. The acoustic multilayer film may have one or more layers of the low acoustic impedance film and two or more layers of the high acoustic impedance film, and the sum of the thickness of one layer of the low acoustic impedance film or an average thickness of any two layers of the low acoustic impedance films and an average thickness of any two layers of the high acoustic impedance films may be 0.07 to 0.15×wavelengths of that of the bulk waves. As a result, the higher-order mode can be excited at a frequency about three times or more that of the fundamental mode. The wavelength of the bulk waves is defined by 2×(thickness of the piezoelectric substrate). It may be defined by an effective thickness (t+mt) including the average thickness mt of the electrodes on both sides of the piezoelectric substrate in the thickness t of the piezoelectric substrate.

In the elastic wave device according to the present invention, it is preferable that the low acoustic impedance films and/or the high acoustic impedance films of the acoustic multilayer film are made of a film containing at least one of an Mg alloy, $SiO_2$, Al, Si, Ge, Ti, ZnO, $Si_xN_y$, $SiO_xF_y$ (where x and y are positive real numbers), AlN, SiC, $Al_2O_3$, Ag, Hf, $TiO_2$, Ni, Au, Ta, Mo, Pt, W, and Cu, or an oxide film, a nitride film, a carbon film, or an iodine film containing at least one of them. The low acoustic impedance film may be made of a film having smaller acoustic impedance than the adjacent high acoustic impedance films.

In the elastic wave device according to the present invention, it is preferable that the piezoelectric substrate is made of single crystals of $LiNbO_3$, $LiTaO_3$, $Li_2B_4O_7$, or langasite. In this case, it is easy to excite the higher-order mode. Since the c-axis oriented piezoelectric polycrystalline thin film such as AlN or ScAlN used in FBAR has a small piezoelectric constant, it is difficult to excite the higher-order mode. A single crystal piezoelectric substrate such as $LiNbO_3$ (LN) or $LiTaO_3$ (LT) has a large coupling coefficient, and unlike a polycrystalline film formed by film formation, an arbitrary azimuth can be used. Therefore, it is possible to utilize the thickness shear vibration using the transverse waves as well as the thickness longitudinal vibration using the longitudinal waves of the bulk waves.

When the elastic wave device according to the present invention utilizes the thickness shear vibration of a piezoelectric substrate made of $LiNbO_3$ crystals, in order to obtain a large impedance ratio, it is preferable that the piezoelectric substrate has Euler angles of either ($0°±5°$, $66.5°$ to $82°$, $0°$ to $180°$) or ($90°±5°$, $90°±5°$, $0°$ to $180°$), or Euler angles crystallographically equivalent thereto. It is more preferable that the piezoelectric substrate has Euler angles of ($0°±5°$, $70°$ to $81°$, $0°$ to $180°$) or Euler angles crystallographically equivalent thereto. It is still more preferable that the piezoelectric substrate has Euler angles of ($0°±5°$, $72°$ to $78°$, $0°$ to $180°$) or Euler angles crystallographically equivalent thereto.

When utilizing the thickness longitudinal vibration of a piezoelectric substrate made of $LiNbO_3$ crystals, in order to obtain a large impedance ratio, it is preferable that the piezoelectric substrate has Euler angles of ($0°±5°$, $119°$ to $133°$, $0°$ to $180°$) or Euler angles crystallographically equivalent thereto. It is more preferable that the piezoelectric substrate has Euler angles of ($0°±5°$, $123°$ to $129°$, $0°$ to $180°$) or Euler angles crystallographically equivalent thereto.

When utilizing the thickness shear vibration of a strip-shaped piezoelectric substrate made of $LiNbO_3$ crystals, in order to obtain a large impedance ratio, it is preferable that the piezoelectric substrate has Euler angles of ($0°±5°$, $-123°$ to $-80°$, $0°$ to) $180°$ or Euler angles crystallographically equivalent thereto. It is more preferable that the piezoelectric substrate has Euler angles of ($0°±5°$, $-112°$ to $-90°$, $0°$ to $180°$) or Euler angles crystallographically equivalent thereto.

When the elastic wave device according to the present invention utilizes the thickness shear vibration of a piezoelectric substrate made of $LiTaO_3$ crystals, in order to obtain a large impedance ratio, it is preferable that the piezoelectric substrate has Euler angles of either ($0°±5°$, $56°$ to $96°$, $0°$ to $180°$) or ($90°±5°$, $90°±5°$, $0°$ to $180°$), or Euler angles crystallographically equivalent thereto. It is more preferable that the piezoelectric substrate has Euler angles of ($0°±5°$, $62°$ to $93°$, $0°$ to $180°$) or Euler angles crystallographically equivalent thereto.

When utilizing the thickness longitudinal vibration of the piezoelectric substrate made of $LiTaO_3$ crystal, in order to obtain a large impedance ratio, it is preferable that the piezoelectric substrate has Euler angles of ($0°±5°$, $112°$ to $138°$, $0°$ to) $180°$ or Euler angles crystallographically equivalent thereto.

When utilizing the thickness shear vibration of the strip-shaped piezoelectric substrate made of $LiTaO_3$ crystals, in order to obtain a large impedance ratio, it is preferable that the piezoelectric substrate has Euler angles of ($0°±5°$, $63°$ to $91°$, $0°$ to) $180°$ or ($90°±5°$, $90°±5°$, $0°$ to $180°$), or Euler angles crystallographically equivalent thereto.

The elastic wave device according to the present invention preferably further includes a holding substrate provided on a side of the acoustic multilayer film opposite to the piezoelectric substrate so that the acoustic multilayer film is sandwiched between the holding substrate and the piezoelectric substrate. The holding substrate may be made of any material as long as it can support the piezoelectric substrate, the electrodes, and the acoustic multilayer film. For example, the holding substrate is made of a Si substrate, a crystal substrate, a sapphire substrate, a glass substrate, a quartz substrate, a germanium substrate, and an alumina substrate.

In the elastic wave device according to the present invention, in order to obtain a large impedance ratio, the piezoelectric substrate may be obtained by stacking two piezoelectric substrates such that one piezoelectric substrate has Euler angles of ($\varphi$, $\theta$, $\psi$) on an upper surface and Euler angles of ($\varphi$, $\theta+180°$, $\psi$) on a lower surface and the other piezoelectric substrate has Euler angles of ($\varphi$, $\theta+180°$, $\psi$) on an upper surface and Euler angles of ($\varphi$, $\theta$, $\psi$) on a lower surface; one piezoelectric substrate has Euler angles of ($\varphi$, $\theta$, $\psi$) on an upper surface and Euler angles of ($\varphi$, $\theta+180°$, $\psi$) on a lower surface and the other piezoelectric substrate has Euler angles of ($\varphi$, $\theta+180°$, $\psi+180°$) on an upper surface and Euler angles of ($\varphi$, $\theta$, $\psi+180°$) on a lower surface; or one piezoelectric substrate has Euler angles of ($\varphi$, $\theta$, $\psi$) on an upper surface and Euler angles of ($\varphi$, $\theta+180°$, $\psi$) on a lower surface and the other piezoelectric substrate has Euler angles of ($\varphi$, $\theta$, $\psi+180°$) on an upper surface and Euler angles of ($\varphi$, $\theta+180°$, $\psi+180°$) on a lower surface, and the elastic wave device may be configured to utilize a higher-order mode about three times or about five times the second harmonic of thickness longitudinal vibration of the piezoelectric substrate. In this case, it is preferable that the piezoelectric substrates are made of $LiNbO_3$ crystals having Euler angles of $\varphi=-5°$ to $5°$, $\theta=119°$ to $133°$, $\psi=0°$ to $180°$, or Euler angles crystallographically equivalent thereto, or $LiTaO_3$ crystals having Euler angles of $\varphi=-5°$ to $5°$, $\theta=112°$ to $138°$, $\psi=0°$ to $180°$, or Euler angles crystallographically equivalent thereto. The wavelength of the bulk waves when two piezoelectric substrates are stacked is 2×(total thickness of the two piezoelectric substrates).

In the elastic wave device according to the present invention, in order to obtain a large impedance ratio, the piezoelectric substrate may be obtained by stacking two piezoelectric substrates such that one piezoelectric substrate has Euler angles of ($\varphi$, $\theta$, $\psi$) on an upper surface and Euler angles of ($\varphi$, $\theta+180°$, $\psi$) on a lower surface and the other piezoelectric substrate has Euler angles of ($\varphi$, $\theta+180°$, $\psi$) on an upper surface and Euler angles of ($\varphi$, $\theta$, $\psi$) on a lower surface; one piezoelectric substrate has Euler angles of ($\varphi$, $\theta$, $\psi$) on an upper surface and Euler angles of ($\varphi$, $\theta+180°$, $\psi$) on a lower surface and the other piezoelectric substrate has Euler angles of ($\varphi$, $\theta+180°$, $\psi+180°$) on an upper surface and Euler angles of ($\varphi$, $\theta$, $\psi+180°$) on a lower surface; or one piezoelectric substrate has Euler angles of ($\varphi$, $\theta$, $\psi$) on an upper surface and Euler angles of ($\varphi$, $\theta+180°$, $\psi$) on a lower surface and the other piezoelectric substrate has Euler angles of ($\varphi$, $\theta$, $\psi+180°$) on an upper surface and Euler angles of ($\varphi$, $\theta+180°$, $\psi+180°$) on a lower surface, and the elastic wave device may be configured to utilize a higher-order mode about three times or about five times the second harmonic of thickness shear vibration of the piezoelectric substrate. In this case, the piezoelectric substrate may be a strip-shaped piezoelectric substrate.

In this case, when utilizing the thickness shear vibration, it is preferable that the piezoelectric substrates are made of $LiNbO_3$ crystals having Euler angles of $\varphi=-5°$ to $5°$, $\theta=66.5°$ to $82°$, $\psi=0°$ to $180°$ or $\varphi=85°$ to $95°$, $\theta=85°$ to $95°$, $\psi=0°$ to $180°$, or Euler angles crystallographically equivalent thereto, or $LiTaO_3$ crystals having Euler angles of $\varphi=-5°$ to $5°$, $\theta=56°$ to $96°$, $\psi=0°$ to $180°$, or $\varphi=85°$ to $95°$, $\theta=85°$ to $95°$, $\psi=0°$ to $180°$, or Euler angles crystallographically equivalent thereto. In the case of the strip-shaped piezoelectric substrate, it is preferable that the piezoelectric substrates are made of LiNbO$_3$ crystals having Euler angles of φ=−5° to 5°, θ=−123° to −80°, ψ=0° to 180°, or Euler angles crystallographically equivalent thereto, or LiTaO$_3$ crystals having Euler angles of φ=−5° to 5°, θ=63° to 91°, ψ=0° to 180°, or φ=85° to 95°, θ=85° to 95°, ψ=0° to 180°, or Euler angles crystallographically equivalent thereto.

When the piezoelectric substrate is obtained by stacking two piezoelectric substrates, it is preferable that the acoustic multilayer film is obtained by alternately stacking one or more layers of the low acoustic impedance film and two or more layers of the high acoustic impedance film, and a sum of the thickness of one layer of the low acoustic impedance film or an average thickness of any two layers of the low acoustic impedance films and an average thickness of any two layers of the high acoustic impedance films is 0.02 to 0.09×wavelength of that of the bulk waves.

Here, Euler angles (φ, θ, ψ) are defined by the right-hand system and represent the cut surface of the piezoelectric substrate and the propagation direction of elastic waves. That is, with respect to the crystals constituting the piezoelectric substrate and the crystal axes X, Y, and Z of LT or LN, the X-axis is rotated by φ counterclockwise about the Z-axis as the rotation axis to obtain the X'-axis. Next, the Z-axis is rotated by θ counterclockwise about the X'-axis as the rotation axis to obtain the Z'-axis. At this time, the surface including the X'-axis using the Z'-axis as a normal line is the cut surface of the piezoelectric substrate. The direction in which the X'-axis is rotated by w counterclockwise about the Z'-axis as the rotation axis is defined as the propagation direction of the elastic waves. The axe perpendicular to the X'-axis and the Z'-axis obtained when the Y-axis is moved by these rotations is defined as the Y'-axis.

By defining Euler angles in this way, for example, 40°-rotated Y-plate X-direction propagation is expressed by Euler angles of (0°, −50°, 0°) and 40°-rotated Y-plate 90° X-direction propagation is expressed by Euler angles of (0°, −50°, 90°). When the piezoelectric substrate is cut at desired Euler angles, an error of up to about ±0.5° may occur for each component of the Euler angles. Regarding the characteristics of elastic waves, there is almost no difference in characteristics due to a deviation of about ±5° for φ and ψ among the Euler angles of (φ, θ, ψ). A plane having the Euler angles of (0°, θ+360°, 0°) is a plane equivalent to a plane having the Euler angles of (0°, θ, 0°). On the other hand, a (0°, θ+180°, 0°) plane is not equivalent to a (0°, θ, 0°) plane in terms of Euler angles, but the planes are in the front and back relationship. However, when a single piezoelectric substrate is used, the elastic wave device shows the same characteristics on the front and back sides. Therefore, in this case, the front and back surfaces of the substrate are regarded to have an equivalent orientation.

According to the present invention, it is possible to provide an elastic wave device capable of obtaining good characteristics while maintaining sufficient mechanical strength in an ultra-high frequency band of 6 GHz or higher.

DETAILED DESCRIPTION OF THE INVENTION

Hereinafter, embodiments of the present invention will be described with reference to the drawings.

FIGS. 1 to 18 show an elastic wave device according to an embodiment of the present invention.

Figure 1:
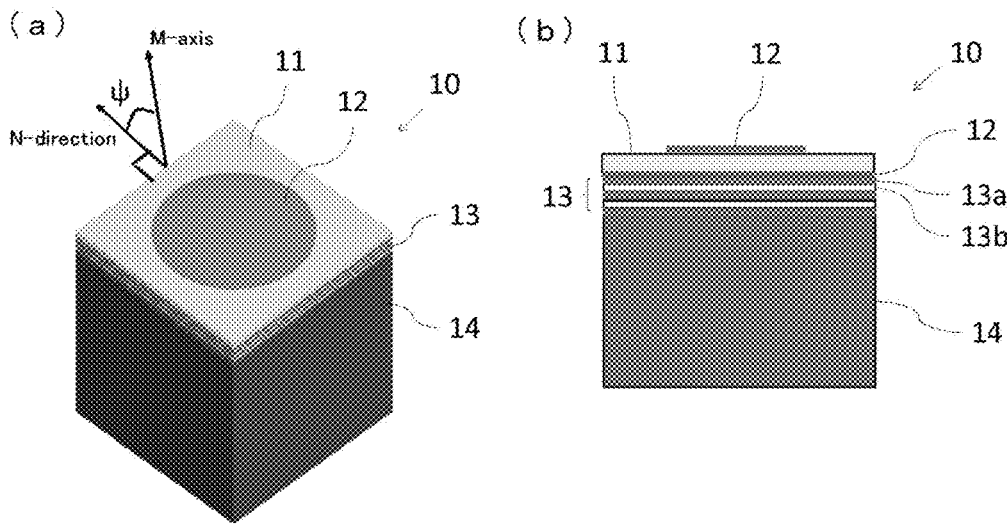
FIG. 1 includes (a) a perspective view showing an elastic wave device according to an embodiment of the present invention, (b) a side view of (a), (c) a perspective view showing a modified example of the elastic wave device of (a) including two upper electrodes, (d) a side view of (c), (e) a perspective view showing a modified example of the elastic wave device of (a) including three upper electrodes, (f) a side view of (e), and (g) an equivalent circuit of (e).
Figure 1:
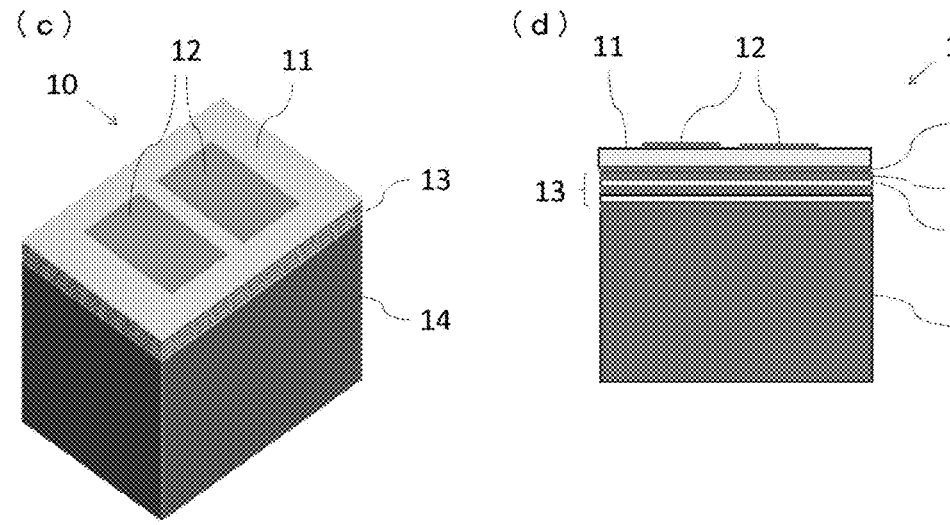
Figure 1:
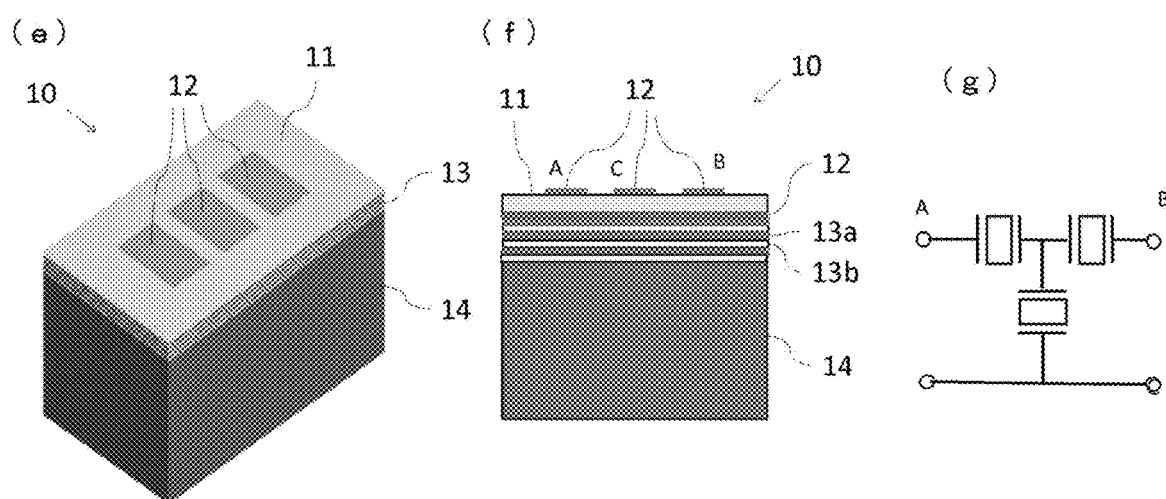
Figure 2:
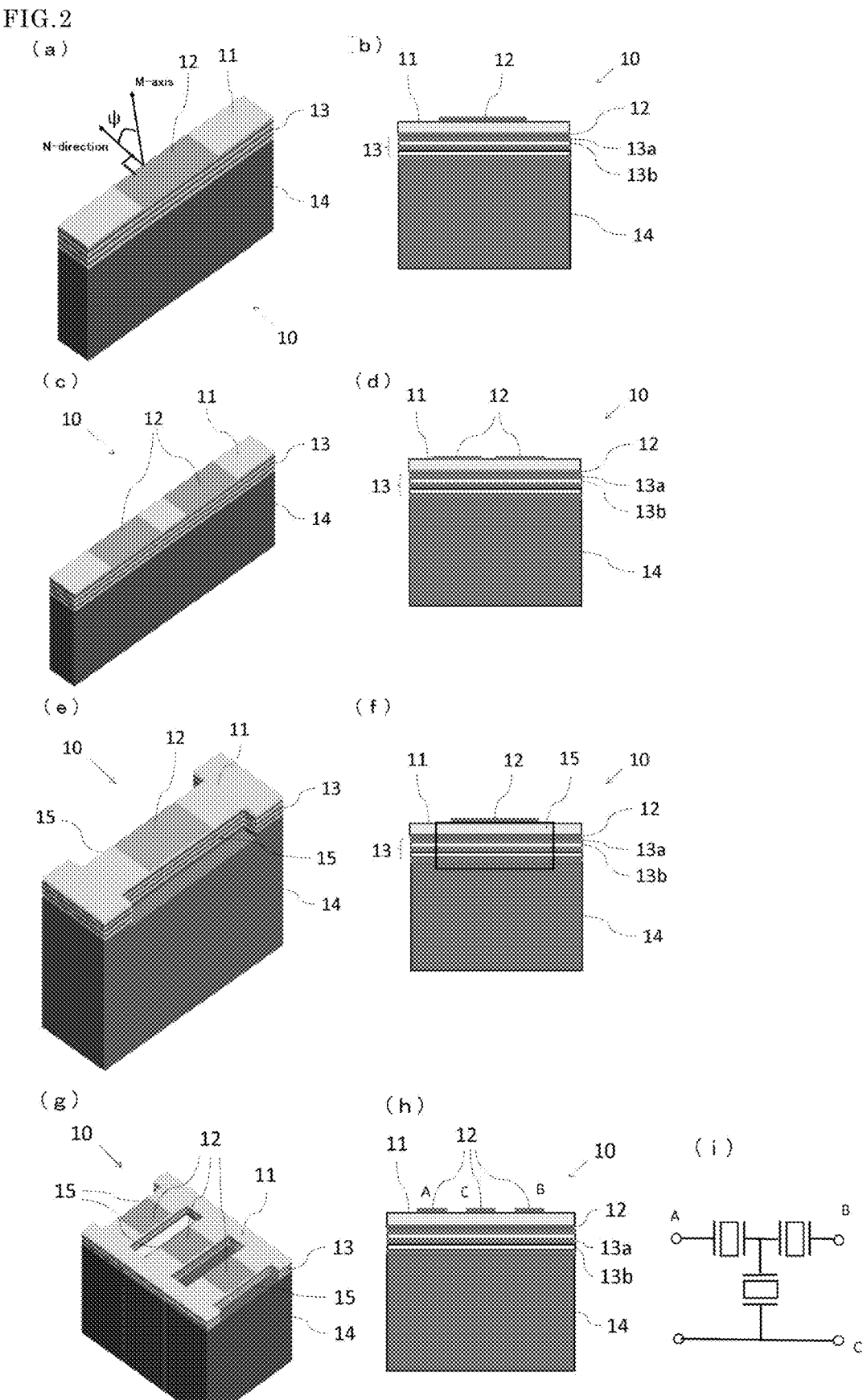
FIG. 2 includes (a) a perspective view showing a modified example of the elastic wave device according to the embodiment of the present invention having an elongated strip-shaped structure, (b) a side view of (a), (c) a perspective view showing a modified example of the elastic wave device of (a) including two upper electrodes, (d) a side view of (c), (e) a perspective view showing a modified example of the elastic wave device of (a) having an elongated groove-shaped notch, (f) a side view of (e), (g) a perspective view showing a modified example of the elastic wave device of (a) having three upper electrodes, (h) a side view of (g), and (i) an equivalent circuit of (g).
Figure 3:
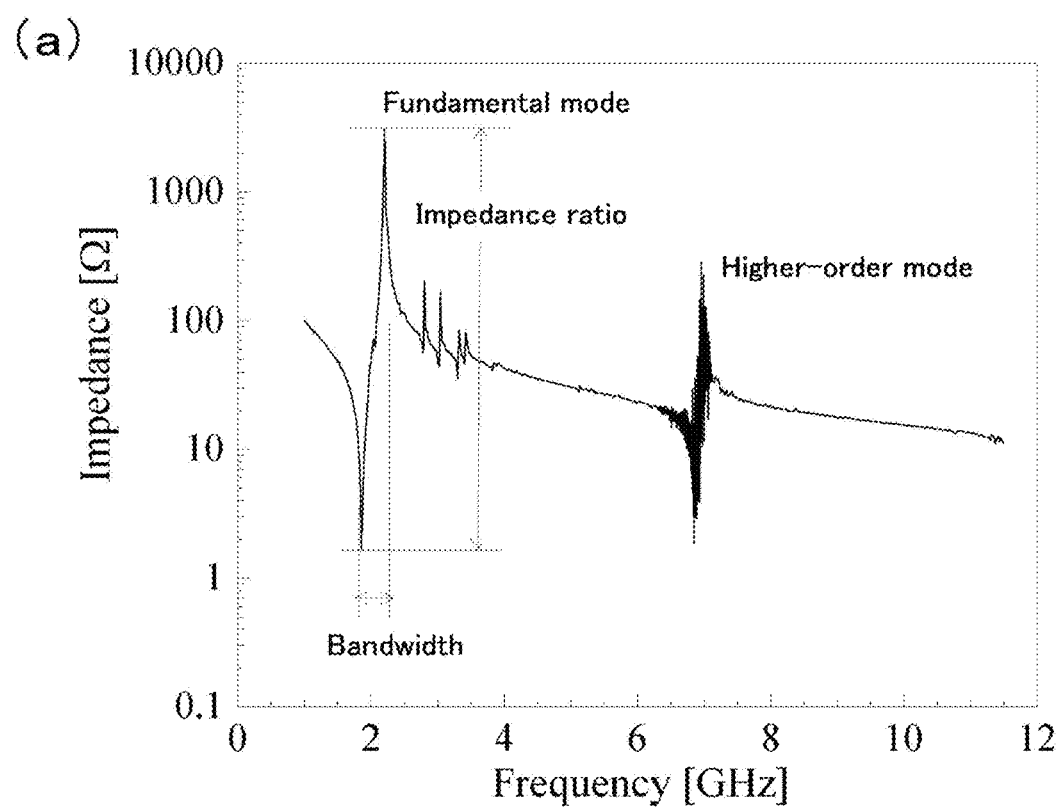
FIGS. 3(a) and 3(b) are graphs showing the frequency characteristics of thickness shear vibration when a (0°, 75°, ψ) LN substrate is used as a piezoelectric substrate of the elastic wave device shown in FIGS. 1(a) and 1(b) and an average thickness of each layer of an acoustic multilayer film is set to 0.25×wavelength and 0.05×wavelength of the wavelength of excited bulk waves, respectively.
Figure 3:
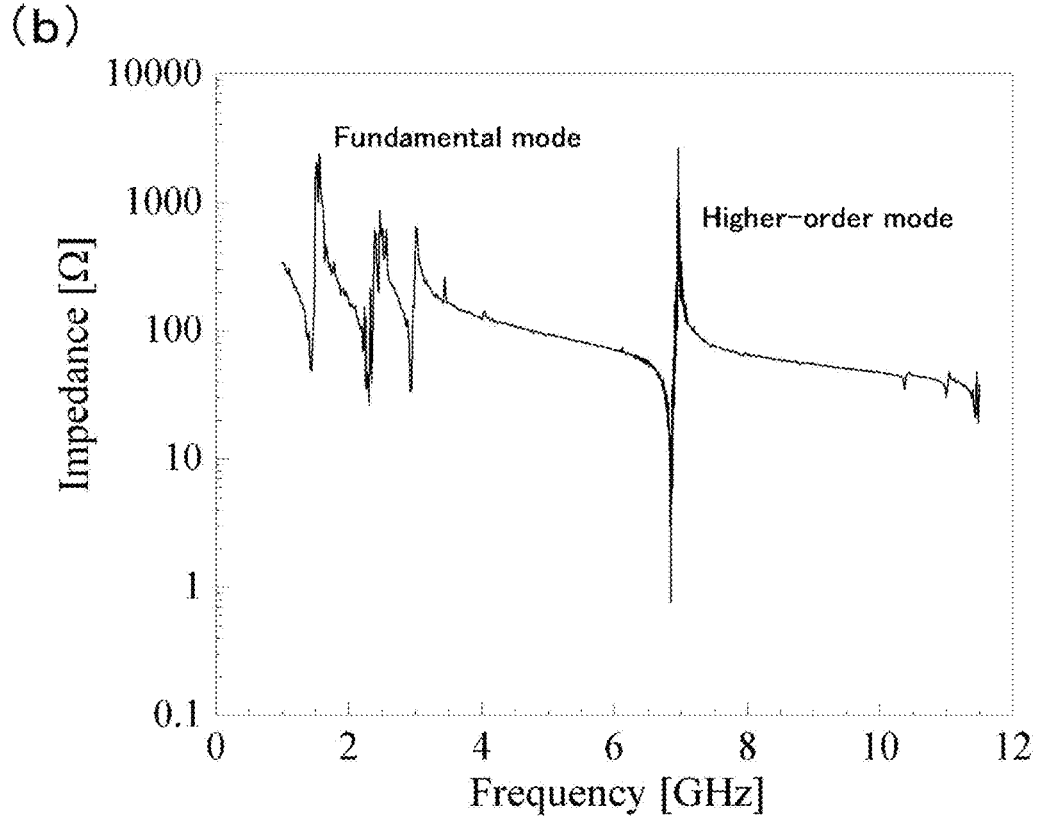

As shown in FIGS. 1 and 2, an elastic wave device 10 is configured to utilize higher-order modes of resonance characteristics of bulk waves, and includes a piezoelectric substrate 11, an electrode 12, an acoustic multilayer film 13, and a holding substrate 14.

The piezoelectric substrate 11 is made of single crystals of LiNbO₃, LiTaO₃, Li₂B₄O₇, or langasite. The electrode 12 is composed of two or more electrodes, each of which has a thin film shape. Each electrode 12 is attached to one surface or the other surface of the piezoelectric substrate 11 along the surface of the piezoelectric substrate 11. Each electrode 12 may be provided so as to cover the entire surface of the piezoelectric substrate 11, or may be provided so as to cover a portion of the surface of the piezoelectric substrate 11. Each electrode 12 may have any planar shape, may be circular as shown in FIG. 1(*a*), or may be rectangular as shown in FIGS. 1(*c*) and 1(*e*).

As shown in FIGS. 1(*a*) and 1(*b*) and FIGS. 2(*a*), 2(*b*), 2(*e*), and 2(*f*), the electrode 12 may be composed of a pair of electrodes, such that the electrodes are provided on one surface and the other surface of the piezoelectric substrate 11. As shown in FIGS. 1(*c*) and 1(*d*), FIGS. 2(*c*) and 2(*d*), the electrode 12 may be composed of three electrodes, such that one electrode 12 is provided as a common electrode so as to cover one surface of the piezoelectric substrate 11 and the remaining two electrodes 12 are provided side by side on the other surface of the piezoelectric substrate 11 so that a structure in which two resonators are connected in series is formed. As shown in FIGS. 1(*e*) and 2(*f*), FIGS. 2(*g*) and 2(*h*), the electrode 12 may be composed of four electrodes, such that one electrode 12 is provided as a common electrode so as to cover one surface of the piezoelectric substrate 11, and the remaining three electrodes are provided side by side on the other surface of the piezoelectric substrate 11 so that a structure in which three resonators are connected in series or parallel is formed. The number of electrodes 12 may be further increased.

As shown in FIGS. 1 and 2, the acoustic multilayer film 13 is attached to the surface of the electrode 12 provided on one surface of the piezoelectric substrate 11 opposite to the piezoelectric substrate 11. In the acoustic multilayer film 13, a low acoustic impedance film 13*a* and a high acoustic impedance film 13*b* are alternately stacked in that order from the side of the piezoelectric substrate 11 to the opposite side. In the acoustic multilayer film 13, it is preferable that the low acoustic impedance film 13*a* and the high acoustic impedance film 13*b* are alternately and continuously stacked in three layers or more and twenty layers or less. In a specific example shown in FIGS. 1 and 2, the layer closest to the piezoelectric substrate 11 is the low acoustic impedance film 13*a*, and the low acoustic impedance film 13*a* and the high acoustic impedance film 13*b* are alternately and continuously stacked in six layers.

Each low acoustic impedance film 13*a* and each high acoustic impedance film 13*b* are made of a film containing at least one of the materials shown in Table 1 or Table 2, or an oxide film, a nitride film, a carbon film or an iodine film containing at least one of them regardless of whether longitudinal waves or transverse waves of bulk waves are used. In Table 1, Zl is the acoustic impedance of the longitudinal waves of the bulk waves, and c33 is the elastic stiffness constant. In Table 2, Zs is the acoustic impedance of the transverse waves of the bulk waves, and c44 is the elastic stiffness constant. Further, x and y of $Si_xN_y$ in Tables 1 and 2 are positive real numbers.

TABLE 1

| Material | Density (kg · m3) | C33 | Vl (m/s) | Zl (Ns/m3) |
|---|---|---|---|---|
| Mg alloy | 1800 | 7.222E+10 | 6334 | 1.140E+07 |
| SiO₂ | 2210 | 7.850E+10 | 5960 | 1.317E+07 |
| Al | 2699 | 1.113E+11 | 6422 | 1.733E+07 |
| Si | 2329 | 2.365E+11 | 10077 | 2.347E+07 |
| Ge | 5323 | 1.26E+11 | 4866 | 2.590E+07 |
| Ti | 4510 | 1.661E+11 | 6069 | 2.737E+07 |
| ZnO | 5665 | 2.096E+11 | 6083 | 3.446E+07 |

TABLE 1-continued

| Material | Density (kg · m3) | C33 | Vl (m/s) | Zl (Ns/m3) |
|---|---|---|---|---|
| $Si_xN_y$ | 3200 | 3.710E+11 | 10767 | 3.446E+07 |
| AlN | 3260 | 3.950E+11 | 11008 | 3.588E+07 |
| SiC | 3200 | 4.580E+11 | 11963 | 3.828E+07 |
| Al₂O₃ | 3800 | 4.170E+11 | 10476 | 3.981E+07 |
| Ag | 10500 | 1.527E+11 | 3814 | 4.004E+07 |
| Hf | 13310 | 1.380E+11 | 3219 | 4.285E+07 |
| Cu | 8930 | 2.106E+11 | 4856 | 4.337E+07 |
| TiO₂ | 4249 | 4.700E+11 | 10517 | 4.469E+07 |
| Ni | 8845 | 3.115E+11 | 5934 | 5.249E+07 |
| Au | 19300 | 2.202E+11 | 3378 | 6.519E+07 |
| Ta | 16678 | 2.668E+11 | 4000 | 6.671E+07 |
| Mo | 10219 | 4.696E+11 | 6779 | 6.927E+07 |
| Pt | 21400 | 3.356E+11 | 3960 | 8.474E+07 |
| W | 19265 | 5.214E+11 | 5202 | 1.002E+08 |

TABLE 2

| Material | Density (kg · m3) | C44 | V (m/s) | Zs (Ns/m3) |
|---|---|---|---|---|
| Mg alloy | 1800 | 1.667E+10 | 3043 | 5.478E+06 |
| SiO₂ | 2210 | 3.120E+10 | 3757 | 8.304E+06 |
| Al | 2699 | 2.610E+10 | 3110 | 8.393E+06 |
| Si | 2329 | 7.227E+10 | 5570 | 1.297E+07 |
| Ti | 4510 | 4.380E+10 | 3116 | 1.405E+07 |
| Ge | 5323 | 4.09E+10 | 2771 | 1.475E+07 |
| ZnO | 5665 | 4.230E+10 | 2733 | 1.548E+07 |
| Ag | 10500 | 3.290E+10 | 1770 | 1.859E+07 |
| $Si_xN_y$ | 3200 | 1.130E+11 | 5942 | 1.902E+07 |
| Hf | 13310 | 2.847E+10 | 1462 | 1.947E+07 |
| AlN | 3260 | 1.180E+11 | 6016 | 1.961E+07 |
| Cu | 8930 | 5.140E+10 | 2399 | 2.142E+07 |
| TiO₂ | 4249 | 1.232E+11 | 5385 | 2.288E+07 |
| SiC | 3200 | 1.650E+11 | 7181 | 2.298E+07 |
| Al₂O₃ | 3800 | 1.460E+11 | 6198 | 2.355E+07 |
| Au | 19300 | 2.990E+10 | 1245 | 2.402E+07 |
| Ni | 8845 | 9.290E+10 | 3241 | 2.867E+07 |
| Mo | 10219 | 1.068E+11 | 3233 | 3.304E+07 |
| Pt | 21400 | 5.968E+10 | 1670 | 3.574E+07 |
| Ta | 16678 | 8.249E+10 | 2224 | 3.709E+07 |
| W | 19265 | 1.604E+11 | 2885 | 5.559E+07 |

Each low acoustic impedance film 13*a* is made of a material having smaller acoustic impedance than the adjacent high acoustic impedance film 13*b*. Each low acoustic impedance film 13*a* may be made of the same material, but may be made of a different material. Each high acoustic impedance film 13*b* may be made of the same material, but may be made of a different material. In a specific example shown in FIGS. 1 and 2, each low acoustic impedance film 13*a* is made of an Al film, and each high acoustic impedance film 13*b* is made of a W film.

The holding substrate 14 is attached to the surface of the acoustic multilayer film 13 opposite to the piezoelectric substrate 11 so that the acoustic multilayer film 13 is sandwiched between the holding substrate 14 and the piezoelectric substrate 11. The holding substrate 14 is provided to support the piezoelectric substrate 11, the electrodes 12, and the acoustic multilayer film 13. In the specific example shown in FIGS. 1 and 2, the holding substrate 14 is made of a Si substrate, but may also be made of a crystal substrate, a sapphire substrate, a glass substrate, a quartz substrate, a germanium substrate, an alumina substrate, and the like.

As shown in FIGS. 1(*a*) and 1(*b*), the elastic wave device 10 may include a pair of electrodes 12. As shown in FIGS. 1(*c*) and 1(*d*), the elastic wave device 10 may have a structure in which two resonators are connected in series such that two electrodes (upper electrodes) 12 are provided on the other surface of the piezoelectric substrate 11 (that is, the surface opposite to the acoustic multilayer film 13) and one electrode (lower electrode) 12 is provided on one surface of the piezoelectric substrate 11. In this case, a multi-mode filter can be formed using the upper electrodes 12 as input/output electrodes and the lower electrode 12 as a common ground electrode.

As shown in FIG. 2, the elastic wave device 10 may have an elongated strip-shaped structure. In this structure, a pair of side surfaces on the long sides of the electrode 12 provided on the other surface of the piezoelectric substrate 11, that is, the surface opposite to the acoustic multilayer film 13, are formed so as to be aligned with the positions of the side surfaces of the piezoelectric substrate 11. In this case, as shown in FIGS. 2(a) and 2(b), the electrodes 12 may be composed of a pair of electrodes. As shown in FIGS. 2(c) and 2(d), the elastic wave device 10 may have a structure in which two resonators are connected in series such that two electrodes (upper electrodes) 12 are provided on the other surface of the piezoelectric substrate 11 and one electrode (lower electrode) 12 is provided on one surface of the piezoelectric substrate 11. In this case, a multi-mode filter can be formed using the upper electrodes 12 as input/output electrodes and the lower electrode 12 as a common ground electrode. As shown in FIGS. 2(e) and 2(f), an elongated groove-shaped (rectangular) notch 15 may be formed in a pair of facing side edges to form a strip-shaped structure so as to extend from the piezoelectric substrate 11 to the acoustic multilayer film 13 while leaving one end and the other end so that the width between the side edges is narrowed.

As shown in FIGS. 1(e) and 1(f), FIGS. 2(g) and 2(h), the elastic wave device 10 may have a structure in which three upper electrodes 12 and one lower electrode are provided and these electrodes 12 are connected. In this case, the three upper electrodes 12 may be used as the input electrode, the output electrode, and the common ground electrode of the filter, respectively, and the lower electrode 12 may be used as the common electrode for connecting the three resonators. In this way, a T-type ladder filter shown by the equivalent circuits of FIG. 1(g) and FIG. 2(i) can be formed. The numbers of upper electrodes 12 and lower electrodes 12 may have four or more and two or more, respectively. In this case, it is possible to form a ladder filter having a larger number of stages. The elastic wave device 10 shown in FIG. 1 can utilize the thickness shear vibration of the piezoelectric substrate 11 or the thickness longitudinal vibration of the piezoelectric substrate 11. The elastic wave device 10 shown in FIG. 2 can utilize the thickness shear vibration of the piezoelectric substrate 11.

Next, the effects will be described.

The elastic wave device 10 can excite higher-order modes (primary mode, secondary mode, and the like) having higher frequencies than the fundamental mode (0th-order) using the acoustic multilayer film 13. By adjusting the type of the piezoelectric substrate 11 and the thickness of each layer of the acoustic multilayer film 13, it is possible to obtain a higher-order mode having a large impedance ratio. By utilizing this higher-order mode, the elastic wave device 10 can obtain good characteristics having a large impedance ratio in an ultra-high frequency band of 6 GHz or higher. By utilizing the higher-order mode, it is not necessary to make the piezoelectric substrate 11 extremely thin, and cavities are not required above and below the piezoelectric substrate 11. Thus, sufficient mechanical strength can be maintained even in an ultra-high frequency band of 6 GHz or higher.

In FIGS. 1(a) and 2(a), the M-axis indicates the Y-axis when the piezoelectric substrate has Euler angles of (±90°, ±90°, ψ), and the X-axis when the piezoelectric substrate has the other Euler angles. Further, ψ is an angle between the M-axis and the direction N perpendicular to the plane in contact with the rotated M-axis, counterclockwise from the M-axis, as shown in FIGS. 1(a) and 2(a).

[Thickness Shear Vibration of LN Substrate]

For the elastic wave device 10 shown in FIGS. 1(a) and 1(b), the frequency characteristics of the thickness shear vibration, the impedance ratio in higher-order modes, and the like were obtained using the piezoelectric substrate 11 of the LN substrate. An Al electrode (thickness: 50 nm) was used as the electrode 12 (hereinafter referred to as "upper electrode") provided on the other surface of the piezoelectric substrate 11, that is, the surface opposite to the acoustic multilayer film 13, an LN substrate (thickness: 1 μm) having Euler angles of (0°, 75°, ψ) was used as the piezoelectric substrate 11, and an Al electrode (thickness: 50 nm) was used as the electrode 12 (hereinafter referred to as "lower electrode") between the piezoelectric substrate 11 and the acoustic multilayer film 13. The low acoustic impedance film 13a of an Al film and the high acoustic impedance film 13b of a W film were alternately stacked in six layers and used as the acoustic multilayer film 13, and a Si substrate was used as the holding substrate 14. Here, the thickness of the Al electrode of the lower electrode and the thickness of the Al film of the low acoustic impedance film 13a on the first layer are distinguished. However, when both Al electrodes are made of the same material, the total film thickness thereof may be used as the thickness of the low acoustic impedance film 13a.

In the electrodes 12, an Al electrode having low density and a small thickness of 50 nm is used as the upper electrode in order to suppress a decrease in frequency due to a mass load. In the following, the Euler angles $(\varphi, \theta, \psi)$ are simply expressed as $(\varphi, \theta, \psi)$.

FIG. 3(a) shows the frequency characteristics when the average thickness of each layer of the acoustic multilayer film 13 is set to 0.25×wavelength of the wavelength of excited bulk waves (half the thickness of the piezoelectric substrate 11). As shown in FIG. 3(a), it was confirmed that the fundamental resonance frequency (fundamental mode) of 1.9 GHz of the thickness shear vibration was strongly excited and an impedance ratio of 73 dB was obtained. It was also confirmed that the impedance ratio in higher-order modes of 6.9 GHz, which is about 3.6 times that of the fundamental mode, was about 40 dB.

Next, FIG. 3(b) shows the frequency characteristics when the average thickness of each layer of the acoustic multilayer film 13 is set to ⅕ of FIG. 3(a), that is, 0.05×wavelength. As shown in FIG. 3(b), it was confirmed that the resonance characteristic of the frequency of the higher-order mode of 6.9 GHz was strongly excited and the impedance ratio of 72 dB was obtained. This is substantially the same as the impedance ratio of 73 dB in the fundamental mode of FIG. 3(a). It was confirmed that the excitation in the frequency band of 1 to 2 GHz of the fundamental mode was divided into three, the respective impedance ratios thereof were suppressed to 17 dB or less, and the influence as spurious was small.

Figure 4:
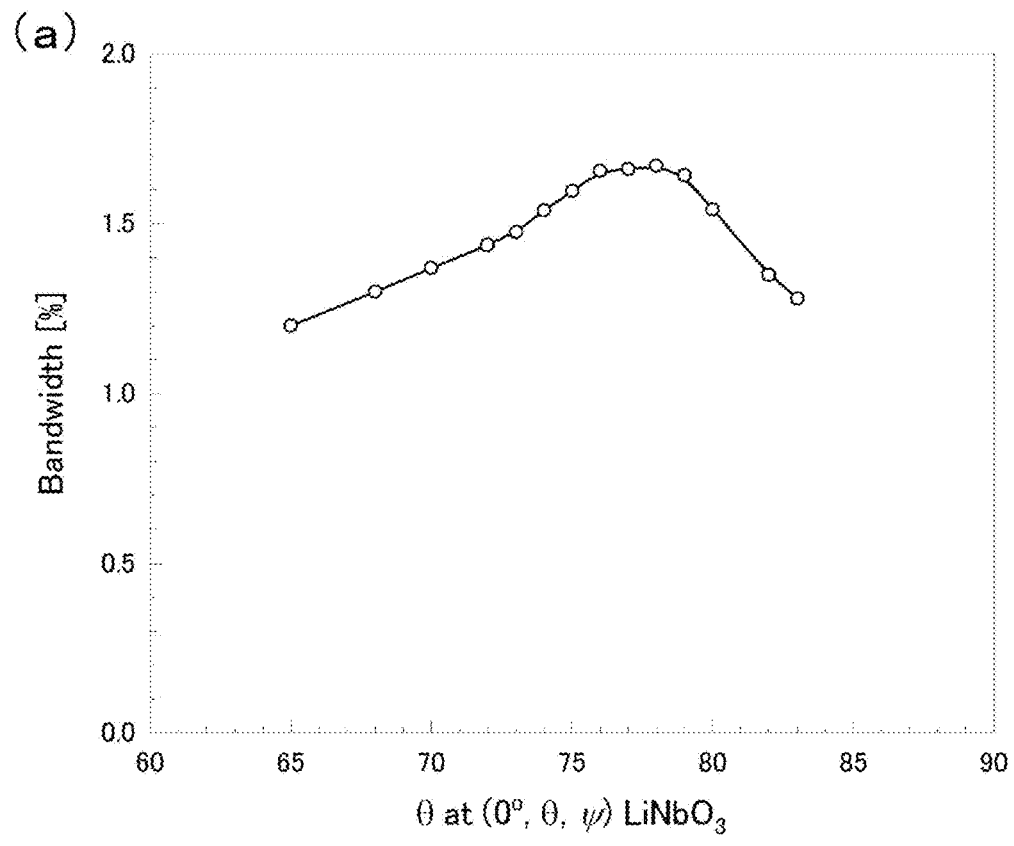
FIGS. 4(a) and 4(b) are graphs showing the θ dependence of a bandwidth and an impedance ratio in higher-order modes of thickness shear vibration when a (0°, θ, ψ) LN substrate is used as the piezoelectric substrate of the elastic wave device shown in FIGS. 1(a) and 1(b) and the average thickness of each layer of the acoustic multilayer film is set to 0.05×wavelength, respectively.
Figure 4:
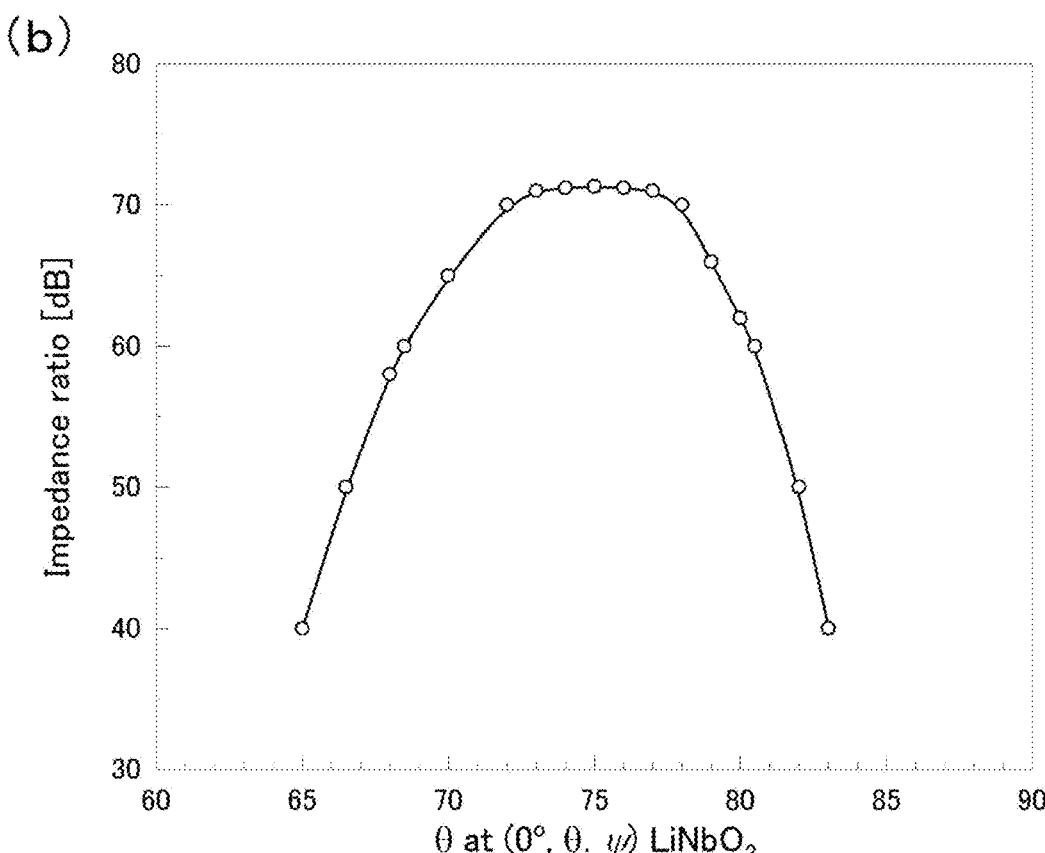

Next, FIGS. 4(a) and 4(b) show the θ dependence of the bandwidth of a higher-order mode of about 7 GHz and an impedance ratio when a (0°, θ, ψ) LN substrate is used as the piezoelectric substrate 11 and the average thickness of each layer of the acoustic multilayer film 13 is set to 0.05× wavelength. In the thickness vibration, the shape of the electrode 12 on a horizontal plane perpendicular to the thickness is substantially symmetrical with respect to the x-direction and the y-direction, so that ψ is 0° to 180° (the same applies hereinafter). As shown in FIG. 4(*b*), it was confirmed that the impedance ratio was 50 dB or more when θ=66.5° to 82°, 60 dB or more when θ=70° to 81°, and 70 dB or more when θ=72° to 78°.

Figure 5:
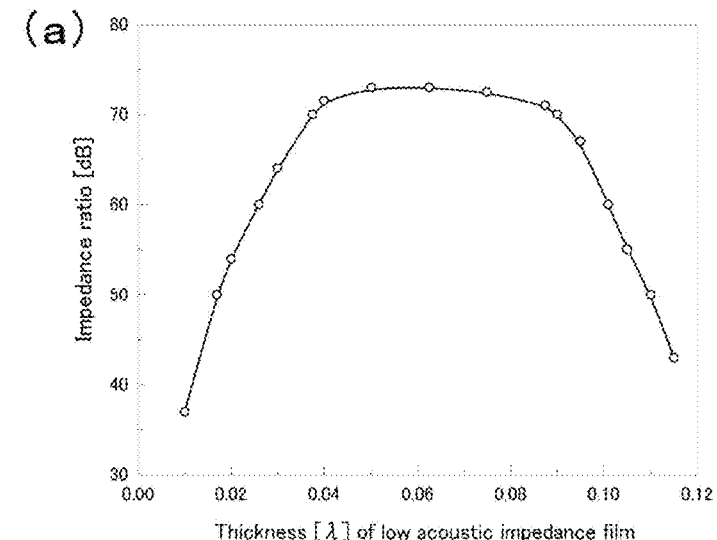
FIG. 5(a) is a graph showing the relationship between a thickness of a low acoustic impedance film and an impedance ratio in higher-order modes of thickness shear vibration when the thickness of a high acoustic impedance film is set to 0.0625×wavelength.
FIG. 5(b) is a graph showing the relationship between a thickness of a high acoustic impedance film and an impedance ratio in higher-order modes of thickness shear vibration when the thickness of a low acoustic impedance film is set to 0.0625×wavelength.
FIG. 5(c) is a graph showing the relationship between an average thickness of each layer of an acoustic multilayer film and an impedance ratio in higher-order modes of thickness shear vibration, when a (0°, 75°, ψ) LN substrate is used as the piezoelectric substrate of the elastic wave device shown in FIGS. 1(a) and 1(b).
Figure 5:
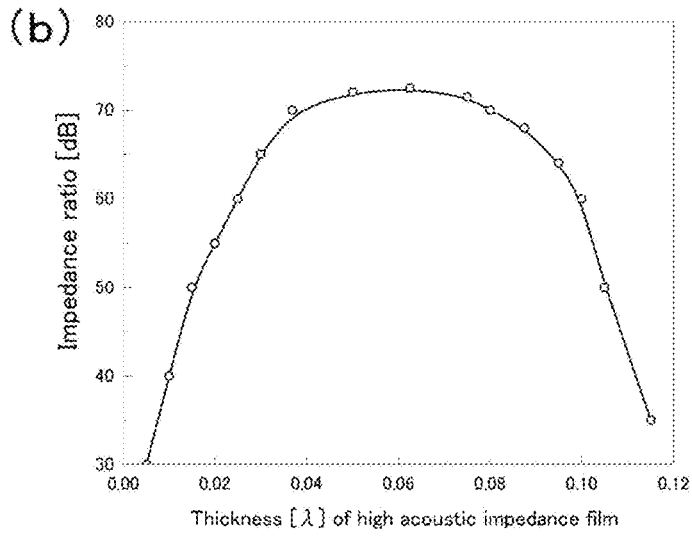
Figure 5:
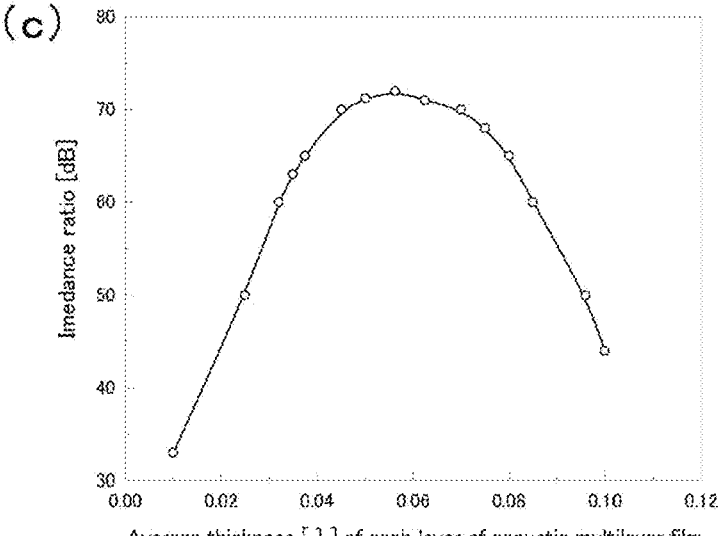

Next, FIG. 5(*a*) shows the relationship between the thickness of the low acoustic impedance film 13*a* and the impedance ratio in a higher-order mode of about 7 GHz, obtained from the results of FIG. 4(*b*), when a (0°, 75°, ψ) LN substrate is used as the piezoelectric substrate 11 and the thickness of the high acoustic impedance film 13*b* is set to 0.0625×wavelength. As shown in FIG. 5(*a*), it was confirmed that the impedance ratio was 50 dB or more when the thickness of the low acoustic impedance film 13*a* was 0.016×wavelength to 0.11×wavelength, 60 dB or more when the thickness was 0.026×wavelength to 0.10×wavelength, and 70 dB or more when the thickness was 0.0375×wavelength to 0.09×wavelength.

Next, FIG. 5(*b*) shows the relationship between the thickness of the high acoustic impedance film 13*b* and the impedance ratio of a higher-order mode of about 7 GHz, obtained when a (0°, 75°, ψ) LN substrate is used as the piezoelectric substrate 11 and the thickness of the low acoustic impedance film 13*a* is set to 0.0625×wavelength. As shown in FIG. 5(*b*), it was confirmed that the impedance ratio was 50 dB or more when the thickness of the high acoustic impedance film 13*b* was 0.016×wavelength to 0.107×wavelength, 60 dB or more when the thickness was 0.025×wavelength to 0.10×wavelength, and 70 dB or more when the thickness was 0.038×wavelength to 0.08×wavelength.

Next, FIG. 5(*c*) shows the relationship between the average thickness of each layer of the acoustic multilayer film 13 and the impedance ratio of a higher-order mode of about 7 GHz, obtained when a (0°, 75°, ψ) LN substrate is used as the piezoelectric substrate 11. As shown in FIG. 5(*c*), it was confirmed that the impedance ratio was 50 dB or more when the average thickness of each layer of the acoustic multilayer film was 0.023×wavelength to 0.097×wavelength, 60 dB or more when the average thickness was 0.032×wavelength to 0.087×wavelength, and 70 dB or more when the average thickness was 0.043×wavelength to 0.08×wavelength.

Figure 6:
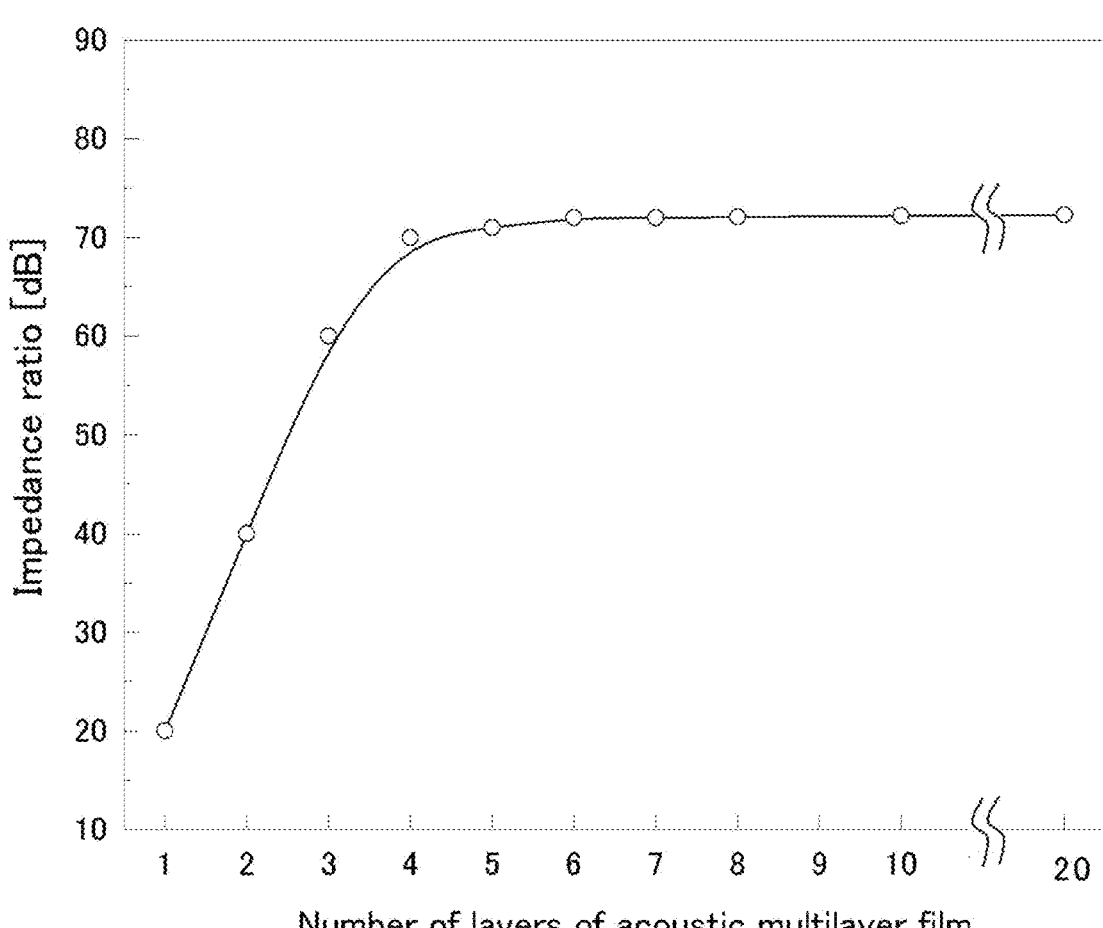
FIG. 6 is a graph showing the relationship between the number of layers of the acoustic multilayer film and an impedance ratio in higher-order modes of thickness shear vibration when a (0°, 75°, ψ) LN substrate is used as the piezoelectric substrate of the elastic wave device shown in FIGS. 1(a) and 1(b) and an average thickness of each layer of the acoustic multilayer film is set to 0.05×wavelength.

Next, FIG. 6 shows the relationship between the number of layers of the acoustic multilayer film 13 and the impedance ratio in a higher-order mode of about 7 GHz, obtained when a (0°, 75°, ψ) LN substrate is used as the piezoelectric substrate 11 and the average thickness of each layer of the acoustic multilayer film 13 is set to 0.05×wavelength. As shown in FIG. 6, it was confirmed that the impedance ratio was 60 dB or more when the number of layers of the acoustic multilayer film 13 was three or more and 70 dB or more when the number of layers was four to twenty. If the number of layers of the acoustic multilayer film 13 exceeds twenty, there are problems in manufacturing such as large warpage or cracking of the piezoelectric substrate 11, so twenty layers or less is preferable.

From the results of FIG. 6, for example, when the thicknesses of the first layer to the fourth layer of the acoustic multilayer film 13 are 0.05×wavelength, and the thicknesses of the fifth layer and the sixth layer are 2×wavelength, the average thickness of the six layers of the acoustic multilayer film 13 is 0.7×wavelength. However, actually, since the thicknesses of the first layer to the fourth layer each satisfy the condition of 0.05×wavelength, high impedance can be realized. Therefore, the average thickness of each layer of the acoustic multilayer film 13 may be calculated by the average thickness of the first to third or fourth layers from the side of the piezoelectric substrate 11, or the average thickness of any continuous three or four layers of the acoustic multilayer film 13. When a very thin multilayer film electrode 12 is used as the electrode 12 at or near the first layer, it may not function as the acoustic multilayer film 13 because it functions as the electrode 12. An electrode 12 such as an Al electrode which can serve as both the electrode 12 and the acoustic impedance film may also be included as a layer of the acoustic multilayer film 13.

Figure 7:
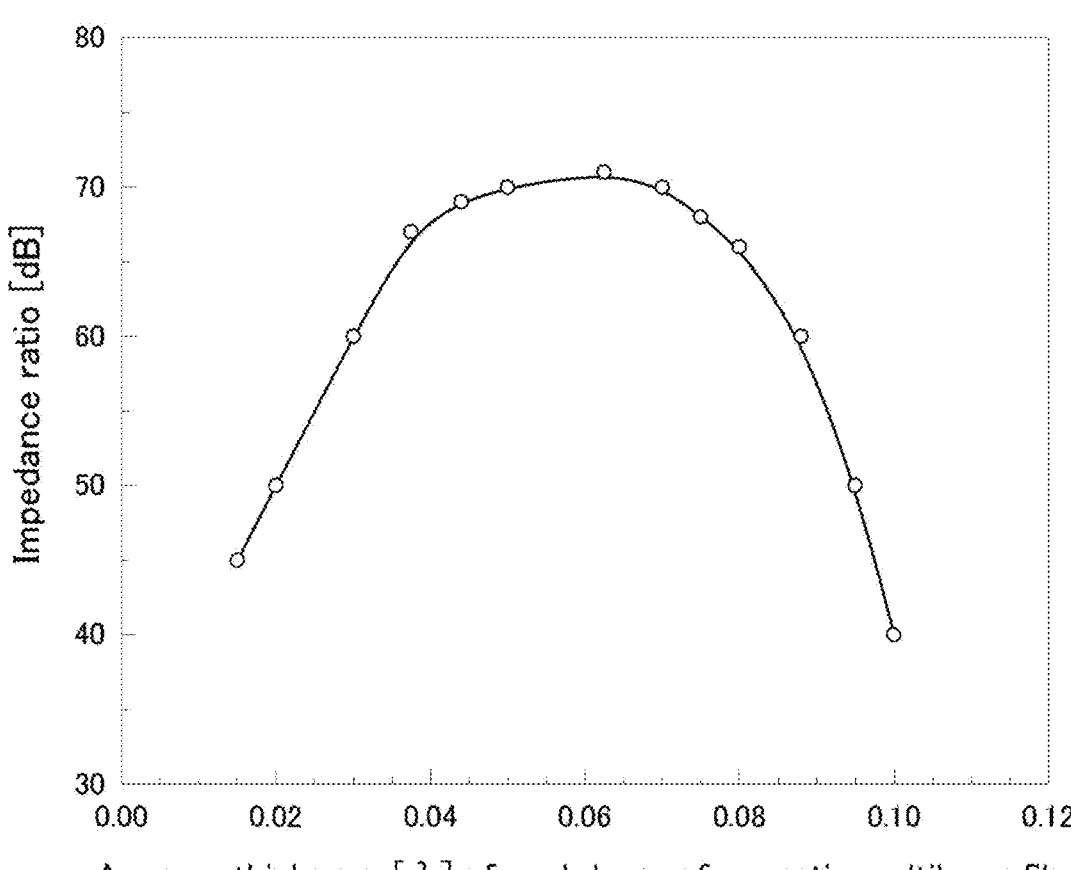
FIG. 7 is a graph showing the relationship between an average thickness of each layer of the acoustic multilayer film and an impedance ratio in higher-order modes of thickness shear vibration when a (90°, 90°, ψ) LN substrate is used as the piezoelectric substrate of the elastic wave device shown in FIGS. 1(a) and 1(b).

Next, FIG. 7 shows the relationship between the average thickness of each layer of the acoustic multilayer film 13 and the impedance ratio in a higher-order mode of about 7 GHz, obtained when a (90°, 90°, ψ) LN substrate is used as the piezoelectric substrate 11. As shown in FIG. 7, it was confirmed that the impedance ratio was 50 dB or more when the average thickness of each layer of the acoustic multilayer film 13 was 0.02×wavelength to 0.095×wavelength, 60 dB or more when the average thickness was 0.03×wavelength to 0.088×wavelength, and 70 dB or more when the average thickness was 0.05×wavelength to 0.07×wavelength.

[Thickness Longitudinal Vibration of LN Substrate]

For the elastic wave device 10 shown in FIGS. 1(*a*) and 1(*b*), the frequency characteristics of the thickness longitudinal vibration, the impedance ratio in higher-order modes, and the like were obtained using the piezoelectric substrate 11 of the LN substrate. An Al electrode (thickness: 50 nm) was used as the upper electrode, a (0°, 126°, ψ) LN substrate (thickness: 1 μm) was used as the piezoelectric substrate 11, and an Al electrode (thickness: 50 nm) was used as the lower electrode. The low acoustic impedance film 13*a* of an Al film and the high acoustic impedance film 13*b* of a W film was alternately stacked in six layers and used as the acoustic multilayer film 13, and a Si substrate was used as the holding substrate 14.

Figure 8:
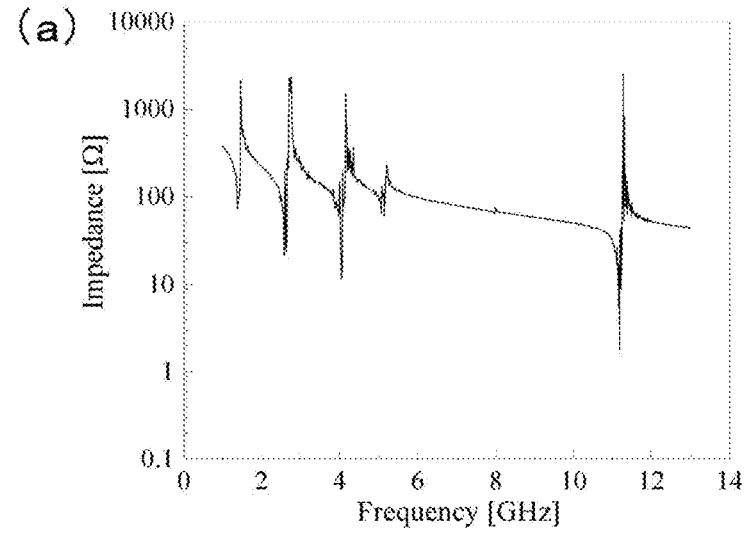
FIG. 8(a) is a graph showing frequency characteristics of thickness longitudinal vibration when a (0°, 126°, ψ) LN substrate is used as the piezoelectric substrate of the elastic wave device shown in FIGS. 1(a) and 1(b) and an average thickness of each layer of the acoustic multilayer film is set to 0.05×wavelength.
FIG. 8(b) is a graph showing the θ dependence of an impedance ratio in higher-order modes of thickness longitudinal vibration when a (0°, θ, ψ) LN substrate is used as the piezoelectric substrate and an average thickness of each layer of the acoustic multilayer film is set to 0.05×wavelength.
FIG. 8(c) is a graph showing the relationship between an average thickness of each layer of the acoustic multilayer film and an impedance ratio in higher-order modes of thickness longitudinal vibration when a (0°, 126°, ψ) LN substrate is used as the piezoelectric substrate.
Figure 8:
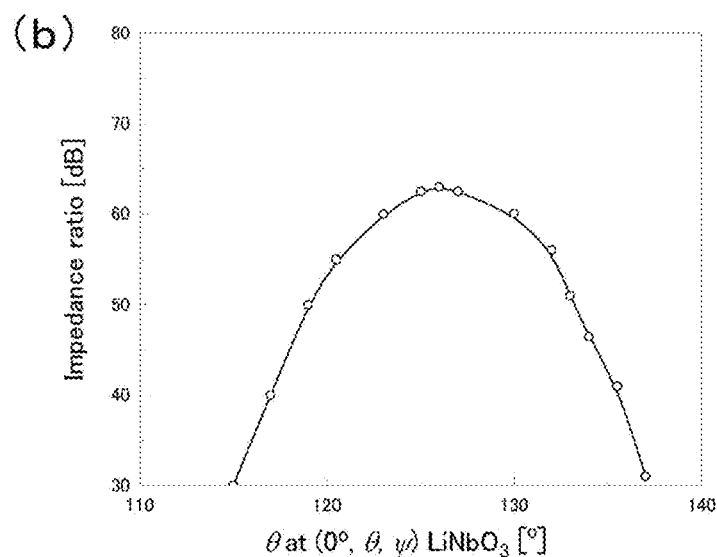
Figure 8:
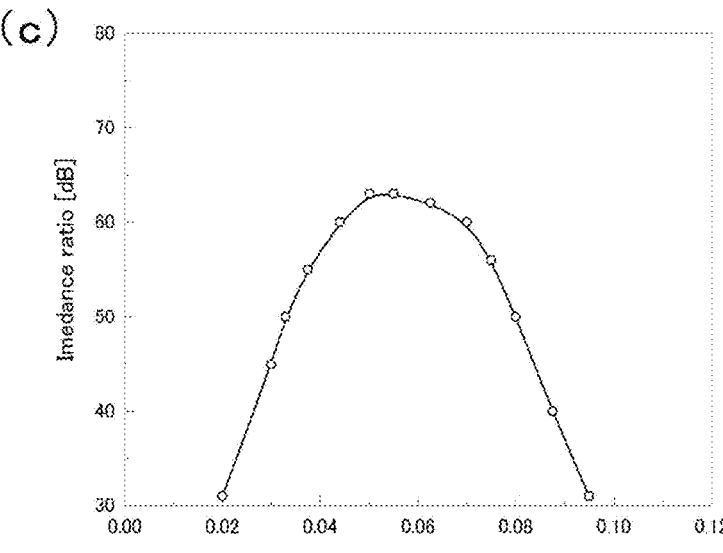

FIG. 8(*a*) shows the frequency characteristics when the average thickness of each layer of the acoustic multilayer film 13 is set to 0.05×wavelength. As shown in FIG. 8(*a*), it was confirmed that, in higher-order modes of the thickness longitudinal vibration, the resonance characteristic of the frequency of 11 GHz, which is about 1.6 times that of the higher-order mode of the thickness shear vibration of FIG. 3(*b*), was strongly excited and an impedance ratio of 63 dB was obtained. The difference in frequency of the higher-order mode is due to the difference between sound velocities of the transverse waves and the longitudinal waves of bulk waves. From these results, it can be seen that when higher-order modes of the thickness longitudinal vibration are used, higher-frequency devices can be realized although the impedance ratio decreases.

Next, FIG. 8(*b*) shows the θ dependence of the impedance ratio in a higher-order mode of about 11 GHz when a (0°, θ, ψ) LN substrate is used as the piezoelectric substrate 11 and the average thickness of each layer of the acoustic multilayer film 13 is set to 0.05×wavelength. As shown in FIG. 8(*b*), it was confirmed that the impedance ratio was 50 dB or more when θ=119° to 133° and 60 dB or more when θ=123° to 129°.

Next, FIG. 8(*c*) shows the relationship between the average thickness of each layer of the acoustic multilayer film 13 and the impedance ratio in a higher-order mode of about 11 GHz, obtained from the results of FIG. 8(*b*), when a (0°, 126°, ψ) LN substrate is used as the piezoelectric substrate 11. As shown in FIG. 8(*c*), it was confirmed that the impedance ratio was 50 dB or more when the average thickness of each layer of the acoustic multilayer film 13 was 0.032×wavelength to 0.08×wavelength and 60 dB or more when the average thickness was 0.043×wavelength to 0.07× wavelength.

[Thickness Shear Vibration of Strip-Shaped LN Substrate]

For the strip-shaped elastic wave device 10 shown in FIGS. 2(*a*) and 2(*b*), the impedance ratio in higher-order modes of the thickness shear vibration and the like were obtained using the piezoelectric substrate 11 of the LN substrate. An Al electrode (thickness: 50 nm) was used as the upper electrode, a (0°, θ, 18°) LN substrate (thickness: 1 μm) was used as the piezoelectric substrate 11, and an Al electrode (thickness: 50 nm) was used as the lower electrode. The low acoustic impedance film 13*a* of an Al film and the high acoustic impedance film 13*b* of a W film were alternately stacked in six layers and used as the acoustic multilayer film 13, and a Si substrate was used as the holding substrate 14.

Figure 9:
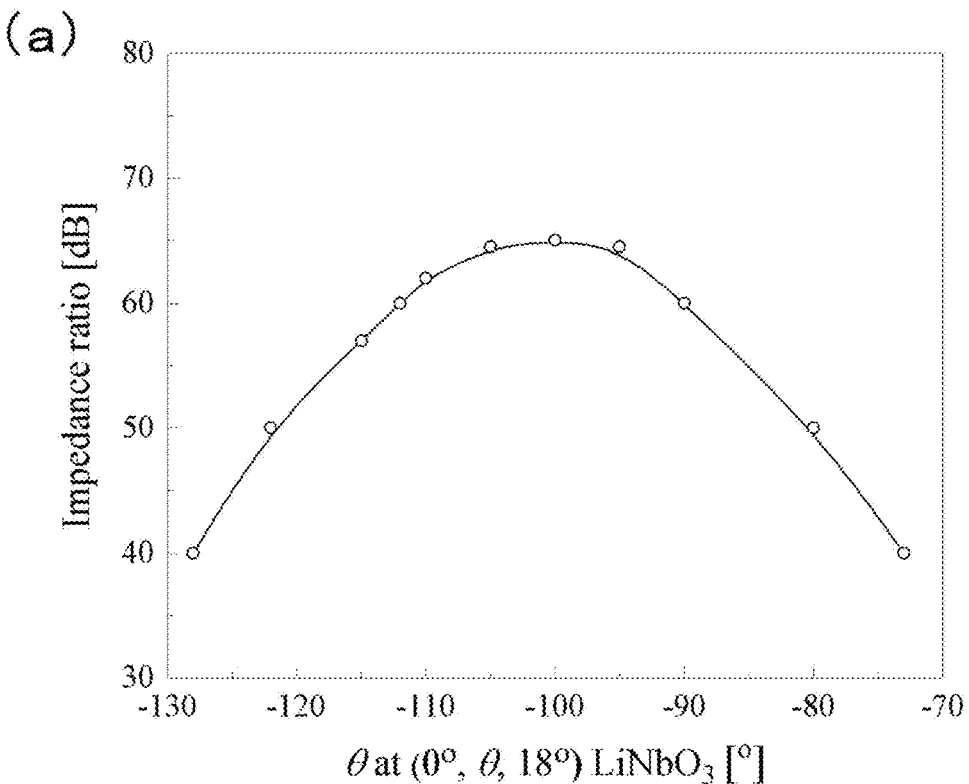
FIG. 9(a) is a graph showing the θ dependence of an impedance ratio in higher-order modes of thickness shear vibration when a (0°, θ, 18°) LN substrate is used as the piezoelectric substrate of the strip-shaped elastic wave device shown in FIGS. 2(a) and 2(b) and an average thickness of each layer of the acoustic multilayer film is set to 0.05×wavelength.
FIG. 9(b) is a graph showing the relationship between an average thickness of each layer of the acoustic multilayer film and an impedance ratio in higher-order modes of thickness shear vibration when a (0°, −100°, 18°) LN substrate is used as the piezoelectric substrate.
Figure 9:
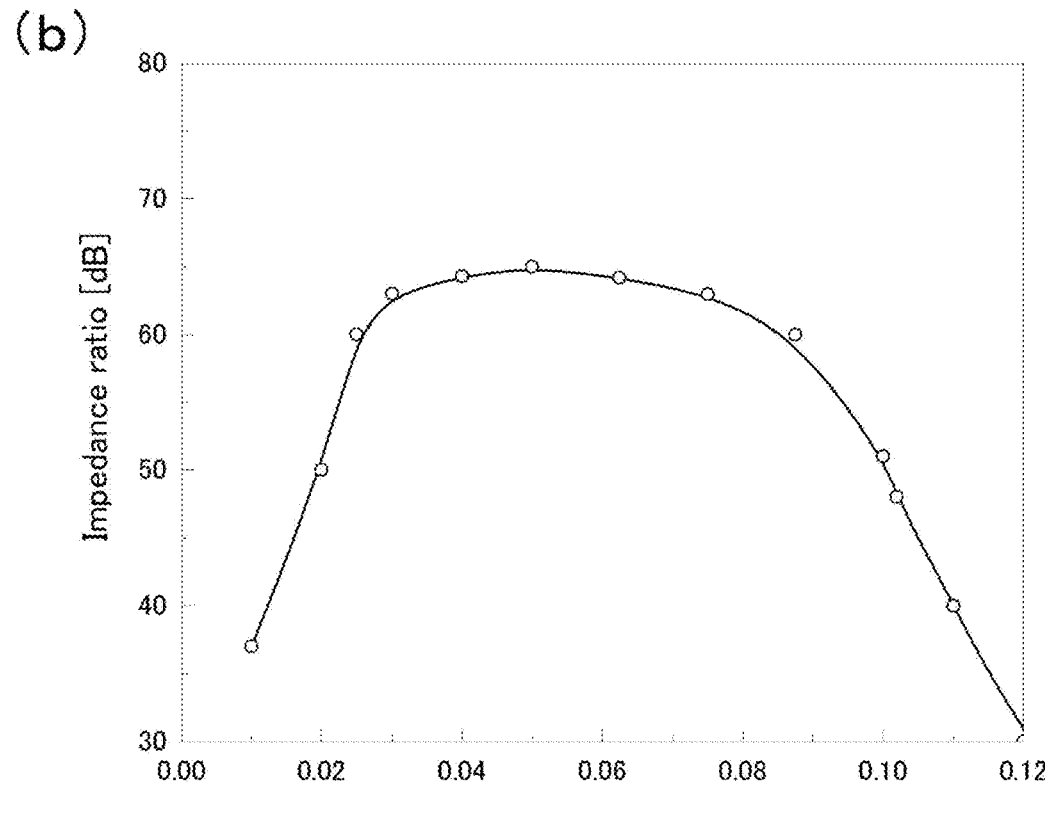

FIG. 9(*a*) shows the θ dependence of the impedance ratio in higher-order modes when the average thickness of each layer of the acoustic multilayer film 13 is set to 0.05× wavelength. As shown in FIG. 9(*a*), it was confirmed that the impedance ratio was 50 dB or more when θ=−123° to −80° and 60 dB or more when θ=−112° to −90°. Although ψ is represented by 18° and the optimal value of ψ is slightly different depending on the structure or the like of the upper electrode 12, a difference in impedance ratio falls within 2 dB in the range of ψ=0° to 180°.

Next, FIG. 9(*b*) shows the relationship between the average thickness of each layer of the acoustic multilayer film 13 and the impedance ratio in higher-order modes, obtained from the results of FIG. 9(*a*), when a (0°, −100°, 18°) LN substrate is used as the piezoelectric substrate 11. As shown in FIG. 9(*b*), it was confirmed that the impedance ratio was 50 dB or more when the average thickness of each layer of the acoustic multilayer film 13 was 0.02×wavelength to 0.1×wavelength, and 60 dB or more when the average thickness was 0.025×wavelength to 0.088×wavelength.

[Thickness Shear Vibration of LT Substrate]

For the elastic wave device 10 shown in FIGS. 1(*a*) and 1(*b*), the impedance ratio in higher-order modes of the thickness shear vibration and the like were obtained using the piezoelectric substrate 11 of the LT substrate. An Al electrode (thickness: 50 nm) was used as the upper electrode, a (0°, θ, ψ) LT substrate (thickness: 1 μm) was used as the piezoelectric substrate 11, and an Al electrode (thickness: 50 nm) was used as the lower electrode. The low acoustic impedance film 13*a* of an Al film and the high acoustic impedance film 13*b* of a W film were alternately stacked in six layers and used as the acoustic multilayer film 13, and a Si substrate was used as the holding substrate 14.

Figure 10:
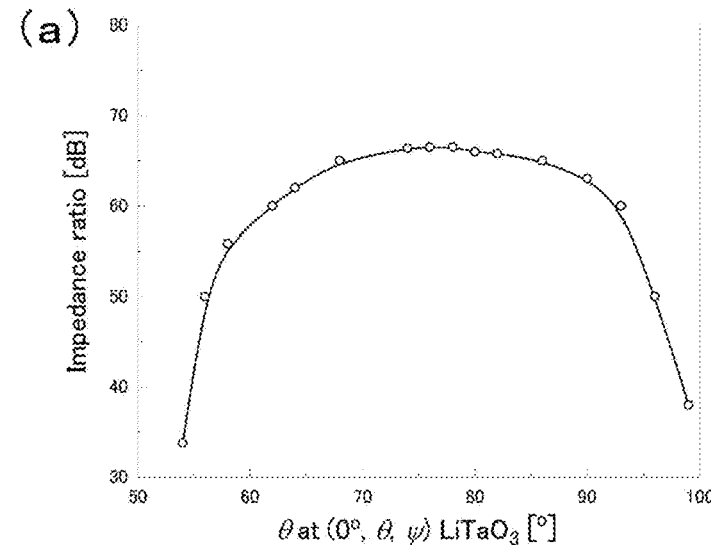
FIG. 10(a) is a graph showing the θ dependence of an impedance ratio in higher-order modes of thickness shear vibration when a (0°, θ, ψ) LT substrate is used as the piezoelectric substrate of the elastic wave device shown in FIGS. 1(a) and 1(b) and an average thickness of each layer of the acoustic multilayer film is set to 0.05×wavelength.
FIG. 10(b) is a graph showing the relationship between an average thickness of each layer of the acoustic multilayer film and an impedance ratio in higher-order modes of thickness shear vibration when a (0°, 74°, ψ) LT substrate is used as the piezoelectric substrate.
FIG. 10(c) is a graph showing the relationship between an average thickness of each layer of the acoustic multilayer film and an impedance ratio in higher-order modes of thickness shear vibration when a (90°, 90°, ψ) LT substrate is used as the piezoelectric substrate.
Figure 10:
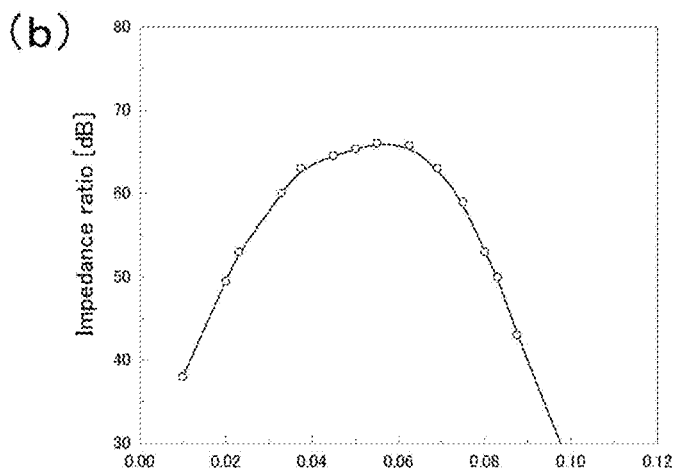
Figure 10:
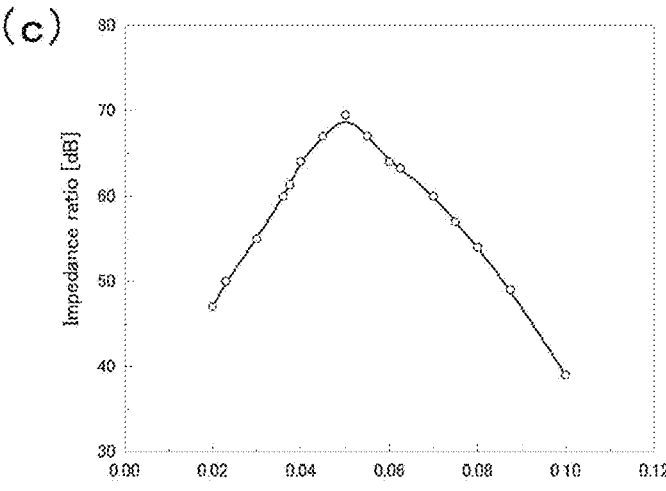

When the LT substrate is used, the frequency of higher-order modes of the thickness shear vibration decreases since the sound velocity of the transverse waves is slower than the LN substrate. The frequency of the higher-order mode when an LT substrate at or near the optimum azimuth angle was about 6.1 GHz. FIG. 10(*a*) shows the θ dependence of the impedance ratio in a higher-order mode of about 6.1 GHz when the average thickness of each layer of the acoustic multilayer film 13 is set to 0.05×wavelength. As shown in FIG. 10(*a*), it was confirmed that the impedance ratio was 50 dB or more when θ=56° to 96° and 60 dB or more when θ=62° to 93°.

Next, FIG. 10(*b*) shows the relationship between the average thickness of each layer of the acoustic multilayer film 13 and the impedance ratio in a higher-order mode of about 6.1 GHz, obtained from the results of FIG. 10(*a*), when a (0°, 74°, ψ) LT substrate is used as the piezoelectric substrate 11. As shown in FIG. 10(*b*), it was confirmed that the impedance ratio was 50 dB or more when the average thickness of each layer of the acoustic multilayer film 13 was 0.02×wavelength to 0.083×wavelength and 60 dB or more when the average thickness was 0.033×wavelength to 0.075×wavelength.

Next, FIG. 10(*c*) shows the relationship between the average thickness of each layer of the acoustic multilayer film 13 and the impedance ratio in a higher-order mode of about 6.1 GHz, obtained when a (90°, 90°, ψ) LT substrate is used as the piezoelectric substrate 11. As shown in FIG. 10(*c*), it was confirmed that the impedance ratio was 50 dB or more when the average thickness of each layer of the acoustic multilayer film 13 was 0.023×wavelength to 0.088× wavelength, and 60 dB or more when the average thickness was 0.036×wavelength to 0.07×wavelength.

[Thickness Longitudinal Vibration of LT Substrate]

For the elastic wave device 10 shown in FIGS. 1(*a*) and 1(*b*), the impedance ratio in higher-order modes of the thickness longitudinal vibration and the like were obtained using the piezoelectric substrate 11 of the LT substrate. An Al electrode (thickness: 50 nm) was used as the upper electrode, a (0°, θ, ψ) LT substrate (thickness: 1 μm) was used as the piezoelectric substrate 11, and an Al electrode (thickness: 50 nm) was used as the lower electrode. The low acoustic impedance film 13*a* of an Al film and the high acoustic impedance film 13*b* of a W film were alternately stacked in six layers and used as the acoustic multilayer film 13, and a Si substrate was used as the holding substrate 14.

Figure 11:
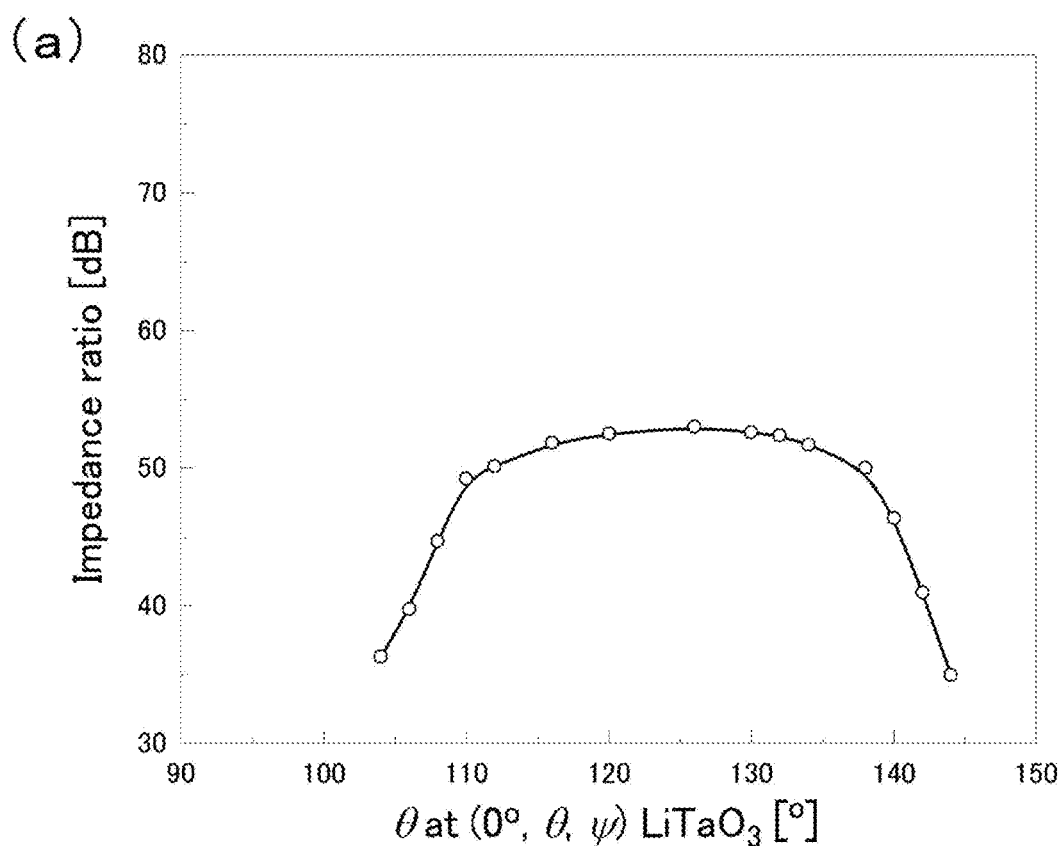
FIG. 11(a) is a graph showing the θ dependence of an impedance ratio in higher-order modes of thickness longitudinal vibration when a (0°, θ, ψ) LT substrate is used as the piezoelectric substrate of the elastic wave device shown in FIGS. 1(a) and 1(b) and an average thickness of each layer of the acoustic multilayer film is 0.05×wavelength.
FIG. 11(b) is a graph showing the relationship between an average thickness of each layer of the acoustic multilayer film and an impedance ratio in higher-order modes of thickness longitudinal vibration when a (0°, 130°, ψ) LT substrate is used as the piezoelectric substrate.
Figure 11:
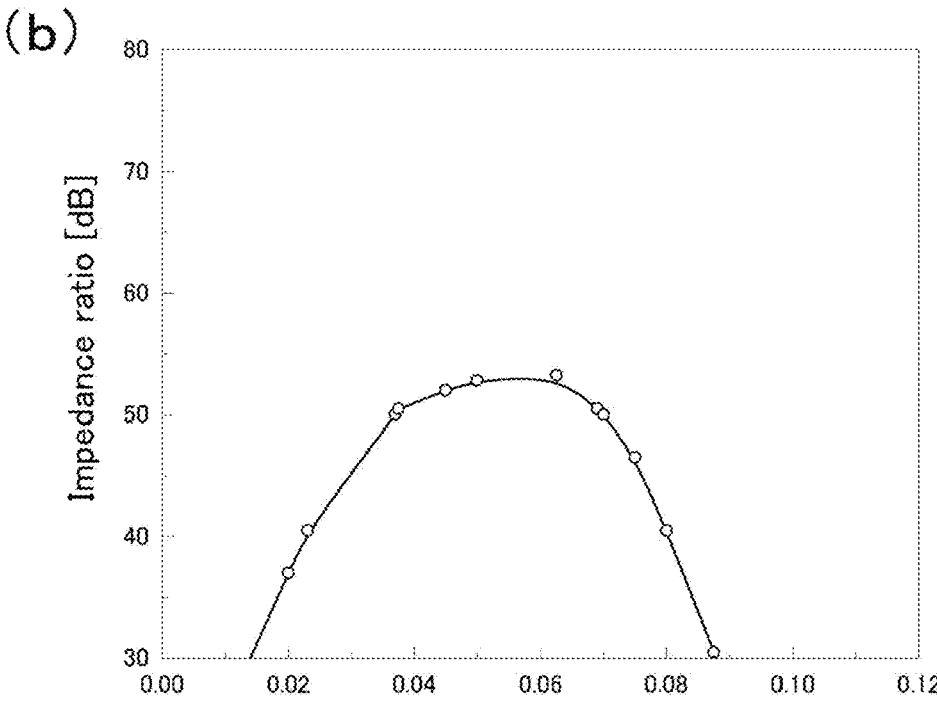

Also, in this case, when the LT substrate is used, the frequency of higher-order modes of the thickness longitudinal vibration decreases since the sound velocity of the longitudinal waves is slower than the LN substrate. The frequency of the higher-order mode when an LT substrate at or near the optimum azimuth angle was about 10 GHz. FIG. 11(*a*) shows the θ dependence of the impedance ratio in a higher-order mode of about 10 GHz when the average thickness of each layer of the acoustic multilayer film 13 is set to 0.05×wavelength. As shown in FIG. 11(*a*), it was confirmed that the impedance ratio was 50 dB or more when θ=112° to 138°.

Next, FIG. 11(*b*) shows the relationship between the average thickness of each layer of the acoustic multilayer film 13 and the impedance ratio in a higher-order mode of about 10 GHz, obtained from the results of FIG. 11(*a*), when a (0°, 130°, ψ) LT substrate is used as the piezoelectric substrate 11. As shown in FIG. 11(*b*), it was confirmed that the impedance ratio was 50 dB or more when the average thickness of each layer of the acoustic multilayer film 13 was 0.037×wavelength to 0.07×wavelength.

[Thickness Shear Vibration of Strip-Shaped LT Substrate]

For the strip-shaped elastic wave device 10 shown in FIGS. 2(*a*) and 2(*b*), the impedance ratio in higher-order modes of the thickness shear vibration and the like were obtained using the piezoelectric substrate 11 of the LT substrate. An Al electrode (thickness: 50 nm) was used as the upper electrode, a (0°, θ, ψ) LT substrate (thickness: 1 μm) was used as the piezoelectric substrate 11, and an Al electrode (thickness: 50 nm) was used as the lower electrode. The low acoustic impedance film 13*a* of an Al film and the high acoustic impedance film 13*b* of a W film were alternately stacked in six layers and used as the acoustic multilayer film 13, and a Si substrate was used as the holding substrate 14.

Figure 12:
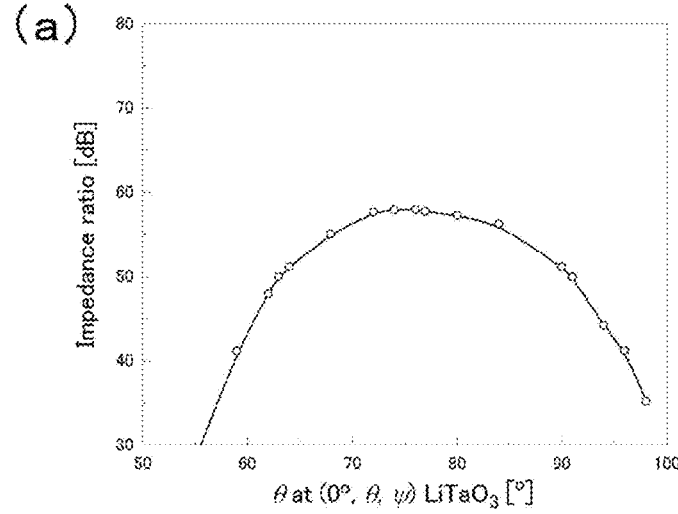
FIG. 12(a) is a graph showing the θ dependence of an impedance ratio in higher-order modes of thickness shear vibration when a (0°, θ, ψ) LT substrate is used as the piezoelectric substrate of the strip-shaped elastic wave device shown in FIGS. 2(a) and 2(b) and an average thickness of each layer of the acoustic multilayer film is set to 0.05×wavelength.
FIG. 12(b) is a graph showing the relationship between an average thickness of each layer of the acoustic multilayer film and an impedance ratio in higher-order modes of thickness shear vibration when a (0°, 74°, 175°) LT substrate is used as the piezoelectric substrate.
FIG. 12(c) is a graph showing the relationship between an average thickness of each layer of the acoustic multilayer film and an impedance ratio in higher-order modes of thickness shear vibration when a (90°, 90°, 37°) LT substrate is used as the piezoelectric substrate.
Figure 12:
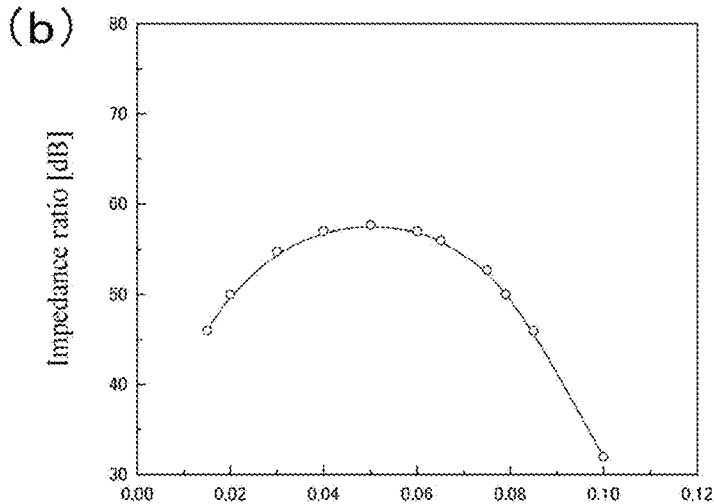
Figure 12:
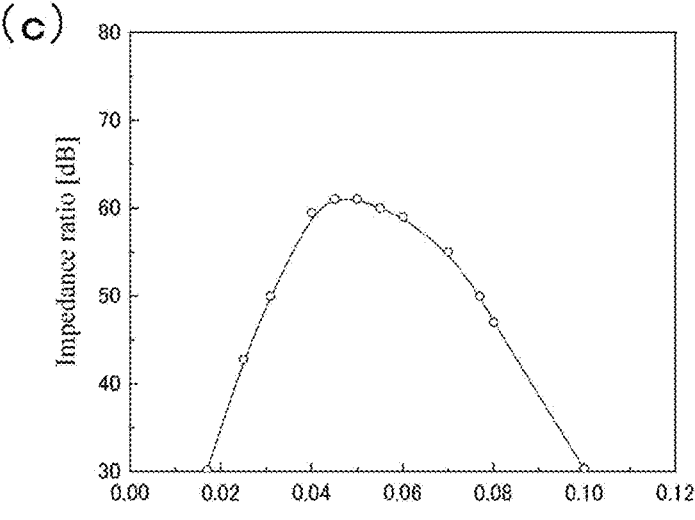

The frequency of the higher-order mode in this case was about 6 GHz. FIG. 12(*a*) shows the θ dependence of the impedance ratio in a higher-order mode of about 6 GHz when the average thickness of each layer of the acoustic multilayer film 13 is set to 0.05×wavelength. As shown in FIG. 12(*a*), it was confirmed that the impedance ratio was 50 dB or more when θ=63° to 91° and 55 dB or more when θ=68° to 86°.

Next, FIG. 12(*b*) shows the relationship between the average thickness of each layer of the acoustic multilayer film 13 and the impedance ratio in a higher-order mode of about 6 GHz, obtained from the results of FIG. 12(*a*), when a (0°, 74°, 175°) LT substrate is used as the piezoelectric substrate 11. As shown in FIG. 12(*b*), it was confirmed that the impedance ratio was 50 dB or more when the average thickness of each layer of the acoustic multilayer film 13 was 0.02×wavelength to 0.08×wavelength, and 55 dB or more when the average thickness was 0.03×wavelength to 0.07× wavelength. Although ψ is represented by 175° and the optimal value of ψ is slightly different depending on the structure or the like of the upper electrode 12, a difference in impedance ratio falls within 2 dB in the range of ψ=0° to 180°.

Next, FIG. 12(*c*) shows the relationship between the average thickness of each layer of the acoustic multilayer film 13 and the impedance ratio in a higher-order mode of about 6 GHz when a (90°, 90°, 37°) LT substrate is used as the piezoelectric substrate 11. As shown in FIG. 12(*c*), it was confirmed that the impedance ratio was 50 dB or more when the average thickness of each layer of the acoustic multilayer film 13 was 0.031×wavelength to 0.077×wavelength, and 60 dB or more when the average thickness was 0.040×wavelength to 0.055×wavelength. Although ψ is represented by 37° and the optimal value of ψ is slightly different depending on the structure or the like of the upper electrode 12, a difference in impedance ratio falls within 2 dB in the range of ψ=0° to 180°.

FIG. 5 and FIGS. 7 to 12 show the relationship between the impedance ratio in higher-order (overtone) modes and the average thickness of each layer of the acoustic multilayer film. However, a large impedance ratio is obtained even when the average thickness of the low acoustic impedance film is greatly different from the average thickness of the high acoustic impedance film. For example, FIG. 13 shows the relationship between the sum of the average thickness of the two layers of the low acoustic impedance film 13a and the average thickness of the two layers of the high acoustic impedance film 13b and the impedance ratio when a (90°, 90°, ψ) LN substrate is used as the piezoelectric substrate 11, and the low acoustic impedance film 13a of a SiO$_2$ film and the high acoustic impedance film 13b of a Ta film are alternately stacked in four layers and used as the acoustic multilayer film 13.

Figure 13:
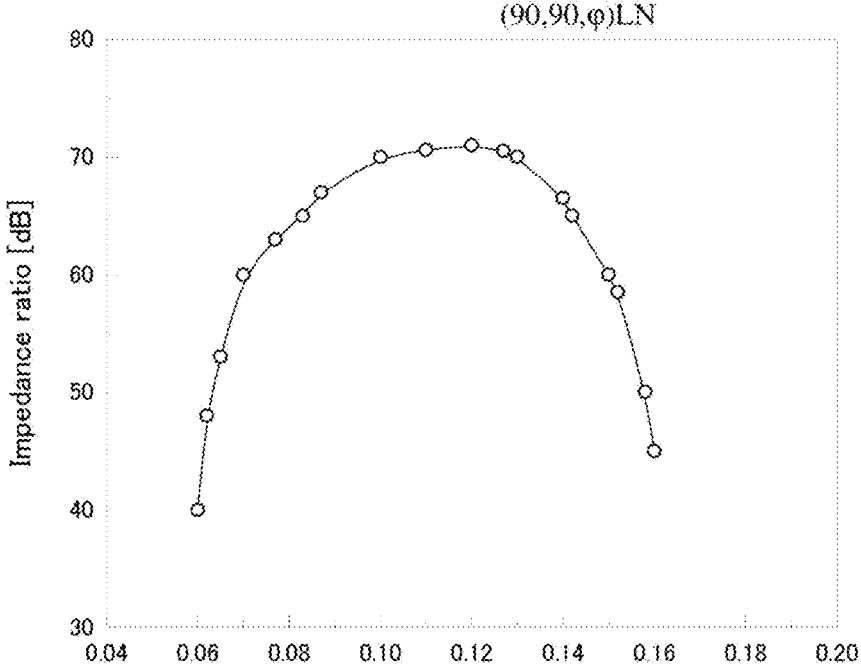
FIG. 13 is a graph showing the relationship between the sum of an average thickness of arbitrary two low acoustic impedance films and an average thickness of arbitrary two high acoustic impedance films and an impedance ratio in higher-order modes of thickness shear vibration when a (90°, 90°, ψ) LN substrate is used as the piezoelectric substrate of the elastic wave device shown in FIGS. 1(a) and 1(b).

As shown in FIG. 13, it was confirmed that the impedance ratio was 60 dB or more when the sum thickness was 0.07 to 0.15×wavelength, 65 dB or more when the sum thickness was 0.083 to 0.142×wavelength, and 70 dB or more when the sum thickness was 0.1 to 0.13×wavelength. This relationship can also be applied to the azimuth angles, the thickness shear vibration, and the thickness longitudinal vibration of LNs and LTs shown in FIG. 5 and FIGS. 7 to 12. A large impedance ratio was obtained when the thickness was 0.07 to 0.15×wavelength, a larger impedance ratio was obtained when the thickness was 0.083 to 0.142×wavelength, and a further larger impedance ratio was obtained when the thickness was 0.1 to 0.13×wavelength.

[Higher-Order Mode when Two Piezoelectric Substrates are Stacked]

Figure 14:
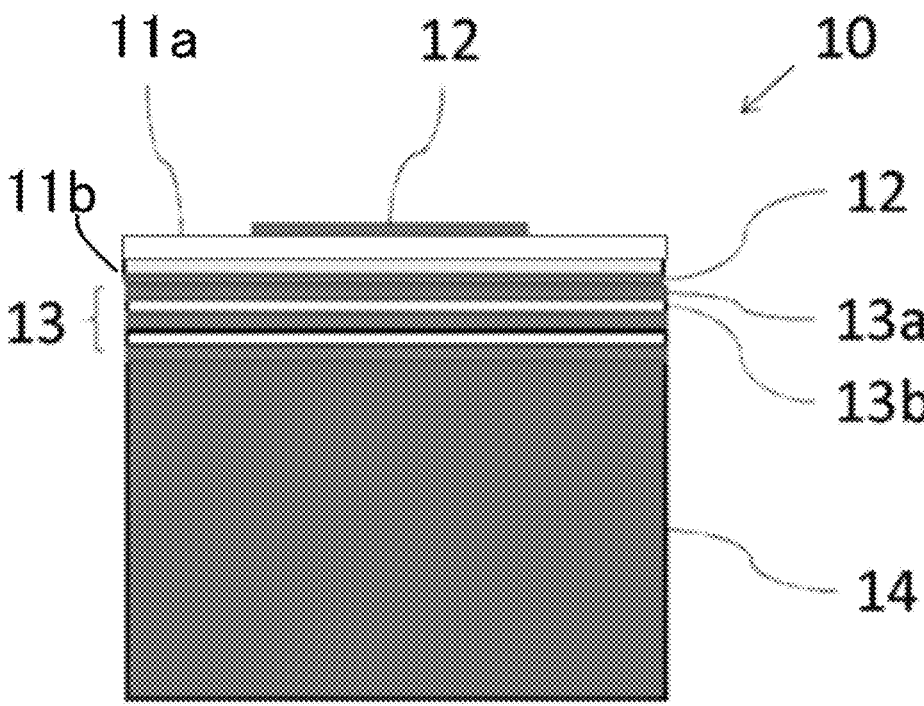
FIG. 14 is a side view showing a modified example of the elastic wave device according to the embodiment of the present invention, including two piezoelectric substrates.
Figure 15:
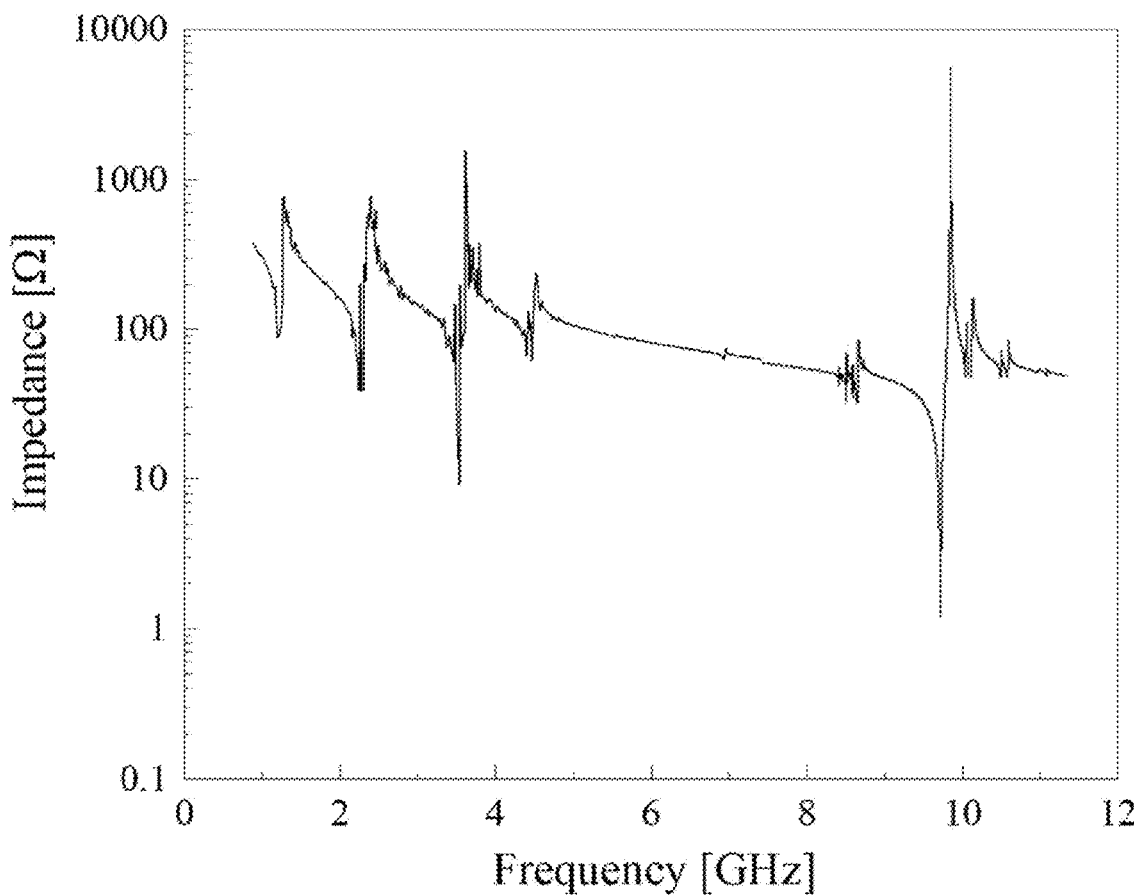
FIG. 15 is a graph showing the frequency characteristics of thickness longitudinal vibration when a (0°, 126°, ψ) LN substrate (0°, 306°, ψ) and a (0°, 306°, w) LN substrate (0°, 126°, ψ) are used as the piezoelectric substrates of the elastic wave device shown in FIG. 14.

In the elastic wave device 10 shown in FIGS. 1(*a*) and 1(*b*), the piezoelectric substrate 11 is a single substrate, but as shown in FIG. 14, the piezoelectric substrate 11 may be obtained by attaching two piezoelectric substrates 11a and 11b. As the structure shown in FIG. 14, for example, a structure was used in which the piezoelectric substrate 11 includes a piezoelectric substrate 11a made of a (0°, 126°, ψ) LN substrate (thickness: 1 μm) and a piezoelectric substrate 11b made of a (0°, 306°, ψ) LN substrate (thickness: 1 μm), Al electrodes (thickness: 100 nm) are provided above and below the piezoelectric substrate 11 as the electrodes 12, respectively, the low acoustic impedance film 13a (thickness: 100 nm) of a SiO$_2$ film and the high acoustic impedance film 13b (thickness: 100 nm) of a Ta film are alternately formed in five layers below the lower electrode as the acoustic multilayer film 13, and a Si substrate is attached to the Ta film at the bottom thereof as the holding substrate 14. FIG. 15 shows the frequency characteristics of the thickness longitudinal vibration of this structure.

In this piezoelectric substrate 11, the two attached piezoelectric substrates 11a and 11b have a structure of a combination of a (0°, 126°, ψ) LN substrate (0°, 306°, ψ) and a (0°, 306°, ψ) LN substrate (0°, 126°, ψ). Here, assuming that the positive (+) Z direction is the positive (+) plane, (0°, −90° to 90°, ψ) is the positive (+) plane of the LN substrate, and (0°, 90° to 270°, ψ) is the negative (−) plane. Thus, this structure corresponds to a bond of −LN+ and +LN−. The positive and negative planes each appear at a period of θ=360°. This structure is different in the substrate material and the azimuth angle from the structure in Patent Literature 1 in which a ZnO film of [0001] orientation (corresponding to (0°, 0°, ψ)) and a ZnO film of [000-1] orientation (corresponding to (0°, 180°, ψ)) are stacked. Polycrystalline thin films such as ZnO films and AlN films are isotropic in the X and Y-directions, to be exact, ψ=∞. Thus, the [0001] oriented film corresponds to (0°, 0°, ∞), and [000-1] oriented film corresponds to (0°, 180°, ∞). Moreover, ψ is indefinite, and there are no positive or negative in the X and Y-directions. As described above, the polycrystalline thin films are significantly different from the single crystal thin sheets. The same applies to a film whose c-axis is oriented parallel to the plane. That is, the [1000] film corresponds to (∞, −90°, 0°) and the [−1000] film corresponds to (∞, 90°, 0°). Moreover, φ is indefinite, and there are no positive or negative in the X and Y-directions. Therefore, even in this orientation, the polycrystalline thin films are significantly different from single crystal thin sheets.

As shown in FIG. 15, the second harmonic was observed at 3.3 GHz, and a higher-order mode three times the second harmonic was observed at 9.8 GHz. In this way, it was confirmed that in the elastic wave device 10 in which two piezoelectric substrates 11a and 11b having different axis orientations are stacked, an overtone response (higher-order mode) about three times that of the second harmonic was excited. Although not shown in FIG. 15, it is also confirmed that the overtone response about 5 times that of the second harmonic is also excited.

The characteristics of the structure shown in FIG. 1(*a*) were compared with the characteristics of the structure shown in FIG. 14. As the structure shown in FIG. 1(*a*), a structure was used in which the piezoelectric substrate 11 is made of a (0°, 126°, ψ) LN substrate (thickness: 2 μm), Al electrodes (thickness: 100 nm) are provided above and below the piezoelectric substrate 11 as the electrodes 12, respectively, the low acoustic impedance film 13a (thickness: 100 nm) of a SiO$_2$ film and the high acoustic impedance film 13b (thickness: 100 nm) of a Ta film are alternately formed in six layers below the lower electrode as the acoustic multilayer film 13, and a Si substrate is attached to the Ta film at the bottom thereof as the holding substrate 14. The above-mentioned structure was used as the structure shown in FIG. 14.

Figure 16:
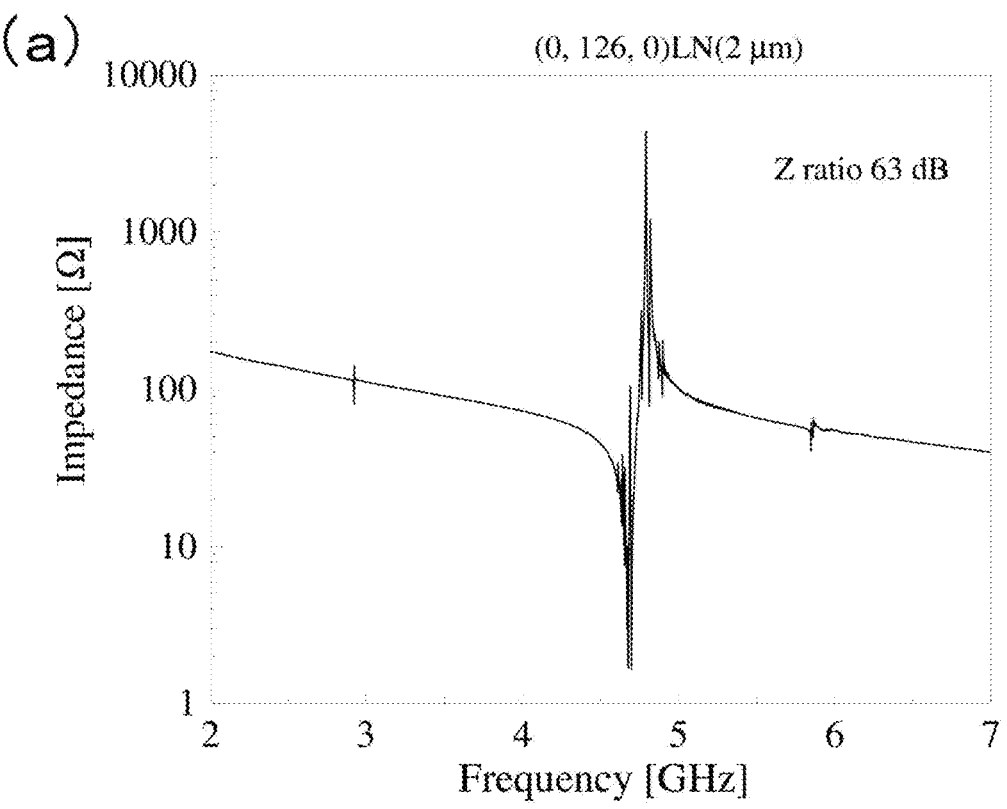
FIG. 16(a) is a graph showing the frequency characteristics at or near a higher-order mode of about three times the fundamental mode of thickness longitudinal vibration when a (0°, 126°, 0°) LN substrate is used as the piezoelectric substrate of the elastic wave device shown in FIGS. 1(a) and 1(b)
FIG. 16(b) is a graph showing the frequency characteristics at or near a higher-order mode (9.8 GHz) of about three times the second harmonic of thickness longitudinal vibration shown in FIG. 15.
Figure 16:
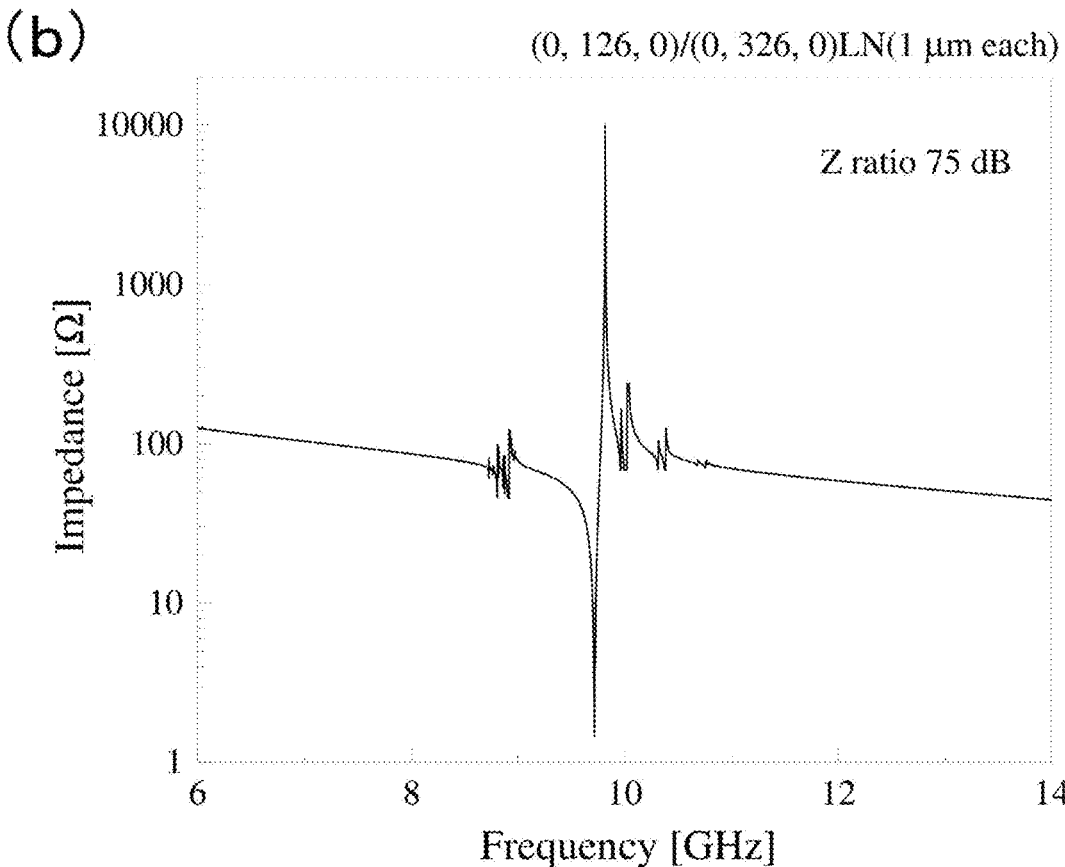

FIGS. 16(*a*) and 16(*b*) show the frequency characteristics of the overtone (higher-order mode) about three times the fundamental mode, of the structure shown in FIG. 1(*a*) and the frequency characteristics of the overtone (higher-order mode) about three times the second harmonic of the structure shown in FIG. 14, respectively. It was confirmed that an impedance ratio of 63 dB was obtained at 4.8 GHz when one piezoelectric substrate 11 was used as shown in FIG. 16(*a*), whereas a larger impedance ratio of 75 dB was obtained at 9.8 GHz when two piezoelectric substrates 11 were used as illustrated in FIG. 16(*b*). It was also confirmed that there was a ripple in the bandwidth in the structure shown in FIG. 1(*a*), as shown in FIG. 16(*a*), whereas there was no ripple in the bandwidth in the structure shown in FIG. 14, as shown in FIG. 16(*b*). As described above, it can be said that a great advantage can be obtained by forming two piezoelectric substrates 11*a* and 11*b* so that positive surfaces or negative surfaces overlap each other as the piezoelectric substrate 11. Although the acoustic multilayer film 13 composed of six layers was examined, the same characteristics are obtained if it is composed of three or more layers.

Next, the following three structures were examined.

Structure A: In the structure shown in FIG. 14, a (0°, 126°, ψ) LN substrate (0°, 306°, ψ) and a (0°, 306°, ψ) LN substrate (0°, 126°, ψ) are used as the piezoelectric substrate 11, and the total thickness of the two substrates is 2 μm.

Structure B: In the structure shown in FIG. 14, a (0°, 126°, ψ) LN substrate (0°, 306°, ψ) and a (0°, 306°, ψ+180°) LN substrate (0°, 126°, ψ+180°) are used as the piezoelectric substrate 11 and the total thickness of the two substrates is 2 μm.

Structure C (Comparative Example): In the structure shown in FIG. 1(*a*), a (0°, 126°, ψ) LN substrate (thickness: 2 μm) is used as the piezoelectric substrate 11.

Figure 17:
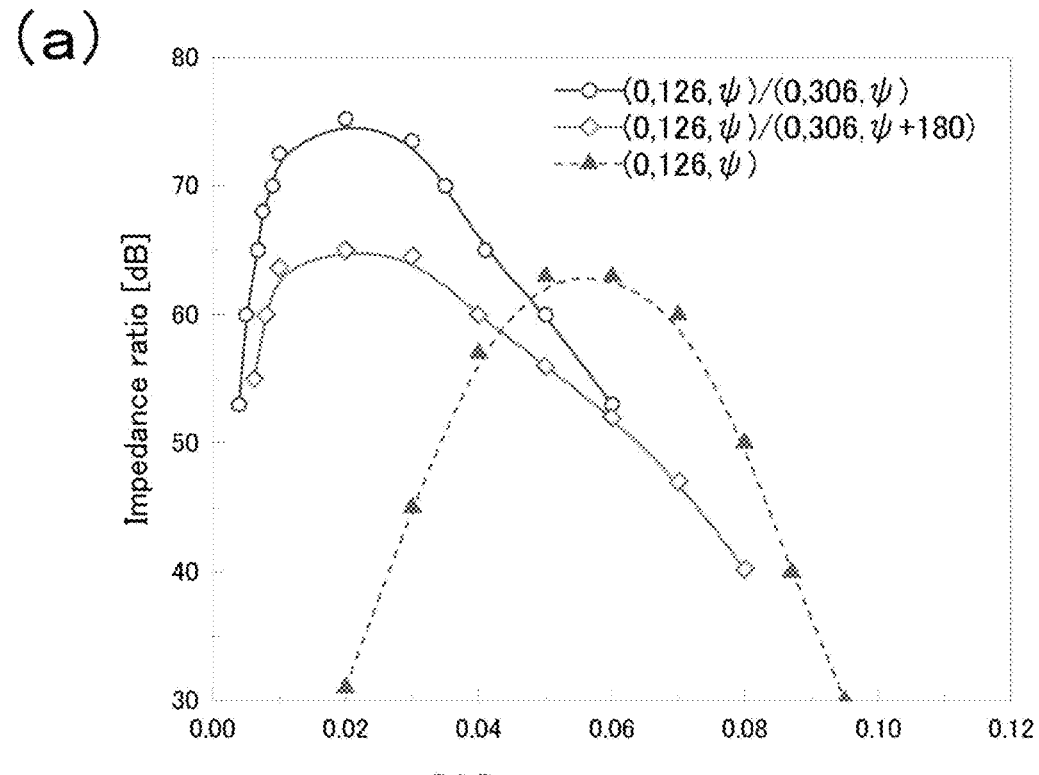
FIG. 17(a) is a graph showing the relationship between the thickness of a low acoustic impedance film and an impedance ratio in higher-order modes of thickness longitudinal vibration and FIG. 17(b) is a graph showing the relationship between the sum of an average thickness of a low acoustic impedance film and an average thickness of a high acoustic impedance film and an impedance ratio in higher-order modes of thickness longitudinal vibration when a (0°, 126°, ψ) LN substrate (0°, 306°, ψ) and a (0°, 306°, ψ) LN substrate (0°, 126°, ψ) are used as the piezoelectric substrates of the elastic wave device shown in FIG. 14, a (0°, 126°, ψ) LN substrate (0°, 306°, ψ) and a (0°, 306°, ψ+180°) LN substrate (0°, 126°, ψ+180°) are used as the piezoelectric substrate, and a (0°, 126°, ψ) LN substrate is used as the piezoelectric substrate of the elastic wave device shown in FIGS. 1(a) and 1(b).
Figure 17:
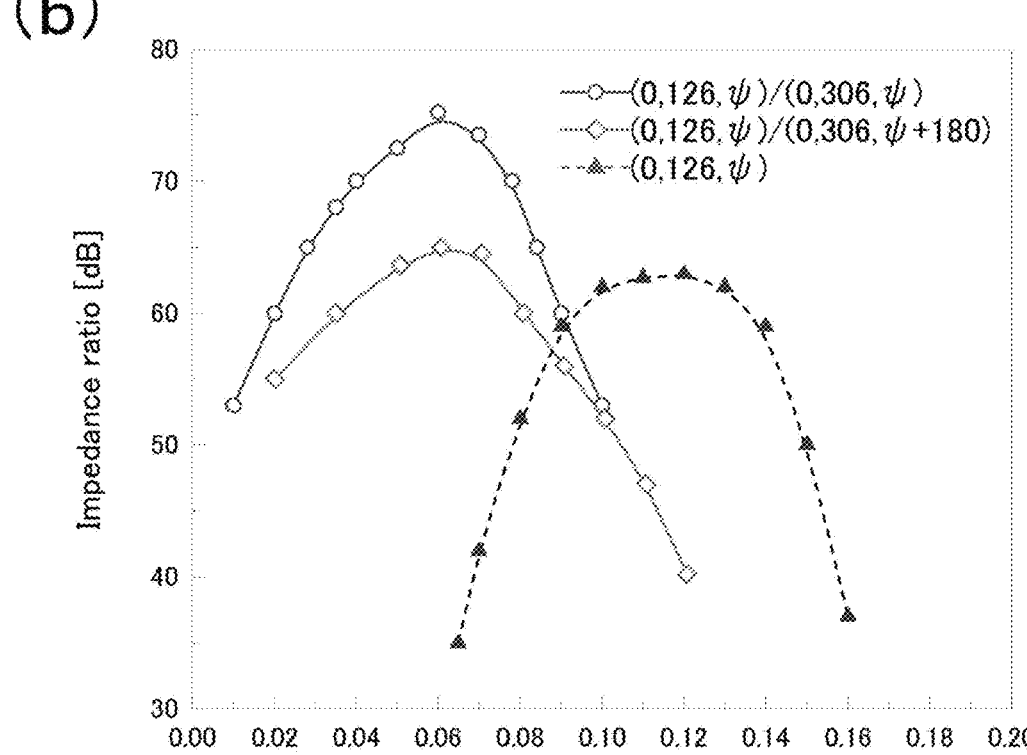

FIG. 17(*a*) shows the relationship between the thickness of the low acoustic impedance film 13*a* of the SiO₂ film and the impedance ratio when the thickness of the high acoustic impedance film 13*b* of the Ta film is set to 0.04×wavelength (the wavelength is 4 μm, which is twice the thickness of the piezoelectric substrate 11) in the three structures A to C. FIG. 17(*b*) shows the sum of the average thickness of the low acoustic impedance film 13*a* and the average thickness of the high acoustic impedance film 13*b* and the impedance ratio in the three structures A to C.

As shown in FIG. 17(*a*), it was confirmed that, in the case of the structure A, the impedance ratio was 60 dB or more when the thickness of the low acoustic impedance film 13*a* was 0.005 to 0.05×wavelength, 65 dB or more when the thickness was 0068 to 0.041×wavelength, and 70 dB or more when the thickness was 0.009 to 0.035×wavelength. Although not shown in the figure, it was confirmed that, when the thickness of the low acoustic impedance film 13*a* was set to 0.04×wavelength and the thickness of the high acoustic impedance film 13*b* was changed, the impedance ratio was 60 dB or more when the thickness of the high acoustic impedance film 13*b* was 0.005 to 0.05×wavelength, 65 dB or more when the thickness was 0.0068 to 0.041× wavelength, and 70 dB or more when the thickness was 0.009 to 0.035×wavelength.

It was confirmed that in the case of the structure B, the impedance ratio was 60 dB or more when the thickness of the low acoustic impedance film 13*a* was 0.008 to 0.04× wavelength. Although not shown in the figure, it was confirmed that, when the thickness of the low acoustic impedance film 13*a* was set to 0.04×wavelength and the thickness of the high acoustic impedance film 13*b* was changed, the impedance ratio was 60 dB or more when the thickness of the high acoustic impedance film 13*b* was 0.008 to 0.04× wavelength. It was confirmed that the impedance ratio of the structure A was about 12 dB larger than that of the structure C, and the impedance ratio of the structure B was about the same as that of the structure C.

As shown in FIG. 17(*b*), it was confirmed that, in the case of the structure A, the impedance ratio was 60 dB or more when the sum of the average thickness of the low acoustic impedance film 13*a* and the average thickness of the high acoustic impedance film 13*b* was 0.02 to 0.09×wavelength, 65 dB or more when the sum was 0.028 to 0.085×wavelength, and 70 dB or more when the sum was 0.04 to 0.08×wavelength. In the case of the structure B, it was also confirmed that the impedance ratio was 60 dB or more when the sum was 0.034 to 0.082×wavelength. It was confirmed that the impedance ratio of the structure A was about 14 dB larger than that of the structure C, and the impedance ratio of the structure B was about the same as that of the structure C. The optimum thicknesses of the low acoustic impedance film 13*a* and the high acoustic impedance film 13*b* in the structures A and B are the same for combinations other than the SiO₂ film and the Ta film. Although not shown in the figure, it was confirmed that the same characteristics as the structure B was obtained for the structure in which the total thickness of the two substrates of the (0°, 126°, ψ) LN substrate (0°, 306°, ψ) and the (0°, 126°, ψ+180°) LN substrate (0°, 306°) was 2 μm.

The results shown in FIGS. 15 to 17 can be applied to second harmonics of other thickness longitudinal vibrations on the LN substrate and the LT substrate. That is, the results can be applied to the following Euler angles conditions for the combination of (φ, θ, ψ) (LN or LT substrate) (φ, θ+180°, ψ) and (φ, θ+180°, ψ) (LN or LT substrate) (φ, θ, ψ), the combination of (φ, θ, ψ) (LN or LT substrate) (φ, θ+180°, ψ) and (φ, θ+180°, ψ+180°) (LN or LT substrate) (φ, θ, ψ+180°), and the combination of (φ, θ, ψ) (LN or LT substrate) (φ, θ+180°, ψ) and (φ, θ, ψ+180°) (LN or LT substrate) (φ, θ+180°, ψ+180°. The Euler angles conditions include: φ=−5° to 5°, θ=119° to 133°, ψ=0° to 180° for LN substrates and the Euler angles crystallographically equivalent thereto; and φ=−5° to 5°, θ=112° to 138°, ψ=0° to 180° for LT substrates and the Euler angles crystallographically equivalent thereto.

Next, the second harmonic of the thickness shear vibration when the piezoelectric substrate 11 was made of two stacked (0°, 74°, 0°) LN substrates was examined. The following six structures of the piezoelectric substrate 11 were examined.

Structure D: (0°, 74°, 0°) LN substrate (0°, 254°, 0°) and (0°, 254°, 0°) LN substrate (0°, 74°, 0°)

Structure E: (0°, 74°, 0°) LN substrate (0°, 254°, 0°) and (0°, 254°, 180°) LN substrate (0°, 74°, 180°)

Structure F: (0°, 74°, 0°) LN substrate (0°, 254°, 0°) and (0°, 74°, 180°) LN substrate (0°, 254°, 180°)

Structure G: (0°, 74°, 0°) LN substrate (0°, 254°, 0°) and (0°, 254°, 90°) LN substrate (0°, 74°, 90°)

Structure H: (0°, 74°, 0°) LN substrate (0°, 254°, 0°) and (0°, 74°, 90°) LN substrate (0°, 254°, 90°)

Structure I (Comparative Example): (0°, 74°, 0°) LN substrate (thickness: 2 μm)

Figure 18:
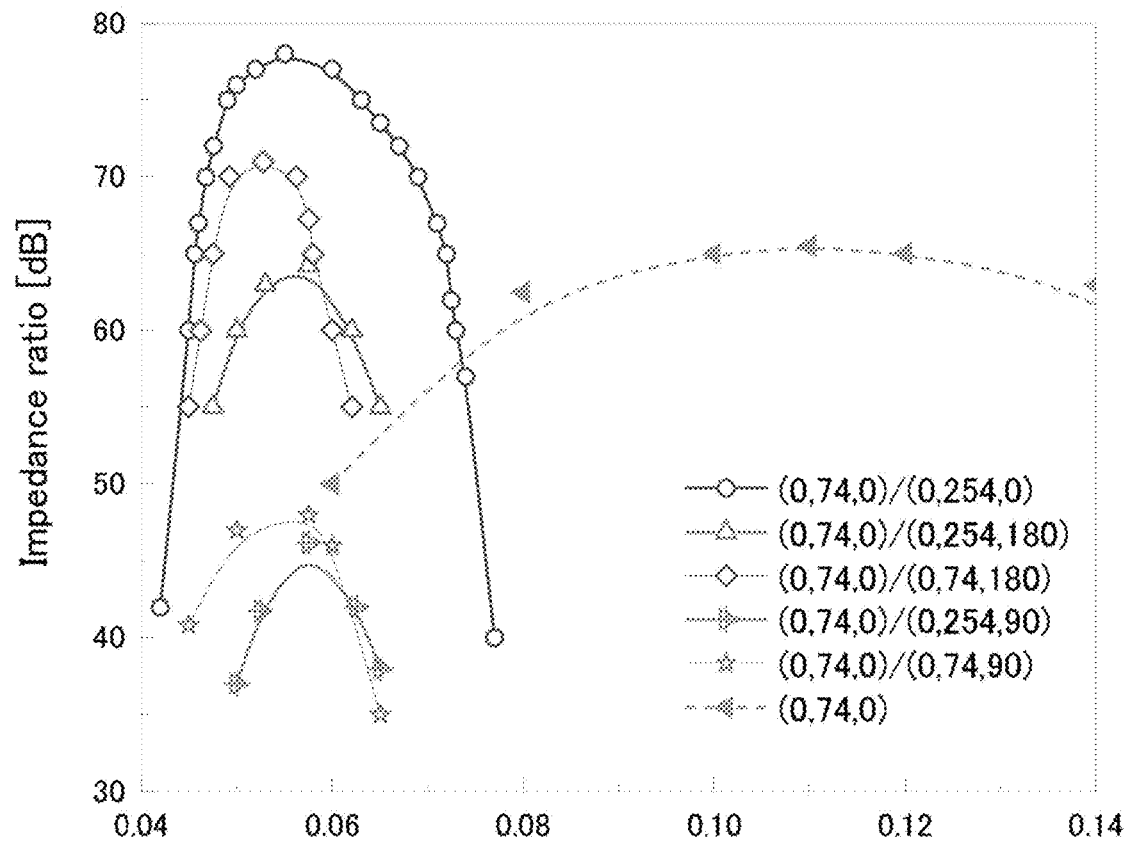
FIG. 18 is a graph showing the relationship between the sum of an average thickness of a low acoustic impedance film and an average thickness of a high acoustic impedance film and an impedance ratio in higher-order modes of thickness shear vibration when a (0°, 74°, 0°) LN substrate (0°, 254°, 0°) and a (0°, 254°, 0°) LN substrate (0°, 74°, 0°), a (0°, 74°, 0°) LN substrate (0°, 254°, 0°) and a (0°, 254°, 180°) LN substrate (0°, 74°, 180°), a (0°, 74°, 0°) LN substrate (0°, 254°, 0°) and a (0°, 74°, 180°) LN substrate (0°, 254°, 180°), a (0°, 74°, 0°) LN substrate (0°, 254°, 0°) and a (0°, 254°, 90°) LN substrate (0°, 74°, 90°), and a (0°, 74°, 0°) LN substrate (0°, 254°, 0°) and a (0°, 74°, 90°) LN substrate (0°, 254°, 90°) are used as the piezoelectric substrates of the elastic wave device shown in FIG. 14 and a (0°, 74°, 0°) LN substrate is used as the piezoelectric substrate of the elastic wave device shown in FIGS. 1(a) and 1(b).

In the five structures D to H, two LN substrates (thickness: 1 μm) were stacked. In these structures, an Al electrode (thickness: 100 nm) was used as the upper and lower electrodes 12 of the piezoelectric substrate 11, the low acoustic impedance film 13*a* of the SiO$_2$ film and the high acoustic impedance film 13*b* of the Ta film were alternately stacked in six layers and used as the acoustic multilayer film 13, and a Si substrate was used as the holding substrate 14. FIG. 18 shows the relationship between the sum of the average thickness of the low acoustic impedance film 13*a* and the average thickness of the high acoustic impedance film 13*b* and the impedance ratio in the six structures D to I.

As shown in FIG. 18, it was confirmed that, in the case of the structure D, the impedance ratio was 60 dB or more when the sum of the average thickness of the low acoustic impedance film 13*a* and the average thickness of the high acoustic impedance film 13*b* was 0.045 to 0.073×wavelength, 65 dB or more when the sum was 0.0456 to 0.072× wavelength, 70 dB or more when the sum was 0.046 to 0.069×wavelength, and 75 dB or more when the sum was 0.049 to 0.063×wavelength. It was also confirmed that, in the case of the structure E, the impedance ratio was 55 dB or more when the sum was 0.047 to 0.065×wavelength and 60 dB or more when the sum was 0.05 to 0.062×wavelength. It was also confirmed that, in the case of the structure F, the impedance ratio was 60 dB or more when the sum was 0.046 to 0.06×wavelength, 65 dB or more when the sum was 0.047 to 0.058×wavelength, and 70 dB or more when the sum was 0.049 to 0.0563×wavelength. It was also confirmed that in the structures G and H, the impedance ratio was 50 dB or less and good characteristics were not obtained. Although the acoustic multilayer film 13 composed of six layers was examined, the same characteristics are obtained if it is composed of three or more layers.

As shown in FIG. 18, it was confirmed that the impedance ratios of the structures D and F were about 15 dB and 8 dB larger than that of the structure I. It was confirmed that the impedance ratio of the structure E was about the same as that of the structure I. It was also confirmed that the thickness of each film of the acoustic multilayer film 13 of the structures D to F when standardized by the wavelength (the wavelength is twice the thickness of the piezoelectric substrate 11) is half that of the structure I.

The results shown in FIG. 18 can be applied to the thickness shear vibration of the LN substrate and the LT substrate, the strip-shaped thickness shear vibration, and the structures of FIGS. 1 and 2. That is, the results can be respectively applied to the following Euler angles conditions for the combination of (φ, θ, ψ) (LN or LT substrate) (φ, θ+180°, ψ) and (φ, θ+180°, ψ) (LN or LT) (φ, θ, ψ) in the structure D, the combination of (φ, θ, ψ) (LN or LT substrate) (φ, θ+180°, ψ) and (φ, θ+180°, ψ+180°) (LN or LT substrate) (φ, θ, ψ+180°) in the structure E, and the combination of (φ, θ, ψ) (LN or LT substrate) (φ, θ+180°, ψ) and (φ, θ, ψ+180°) (LN or LT substrate) (φ, θ+180°, ψ+180°) in the structure F. The Euler angles conditions includes φ=−5° to 5°, θ=66.5° to 82°, ψ=0° to 180°, and φ=85° to 95°, θ=85° to 95°, ψ=0° to 180° for LN substrates and the Euler angles crystallographically equivalent thereto. The Euler angles conditions also include φ=−5° to 5°, θ=56° to 96°, ψ=0° to 180°, and φ=85° to 95°, θ=85° to 95°, ψ=0° to 180° for LT substrates and the Euler angles crystallographically equivalent thereto. In the case of the strip-shaped thickness shear vibration, the Euler angles conditions include: φ=−5° to 5°, θ=−123° to −80°, ψ=0° to 180° for LN substrates and the Euler angles crystallographically equivalent thereto; and φ=−5° to 5°, θ=63° to 91°, ψ=0° to 180° and φ=85° to 95°, θ=85° to 95°, ψ=0° to 180° for LT substrates and the Euler angles crystallographically equivalent thereto.

REFERENCE SIGNS LIST

10 Elastic wave device
11 Piezoelectric substrate
12 Electrode
13 Acoustic multilayer film
13*a* Low acoustic impedance film
13*b* High acoustic impedance film
14 Holding substrate
15 Notch

What is claimed is:

1. An elastic wave device comprising:
a piezoelectric substrate;
an electrode provided in contact with the piezoelectric substrate; and
an acoustic multilayer film provided in contact with at least one of the piezoelectric substrate and the electrode; wherein
the elastic wave device is configured to utilize, separately from a fundamental mode of resonance characteristics of bulk waves, one of a higher-order mode about three times a fundamental mode, a higher-order mode about five times the fundamental mode, or higher-order modes having a frequency about three times or more than a frequency of the fundamental mode of resonance characteristics of bulk waves.

2. The elastic wave device according to claim 1, wherein the acoustic multilayer film is obtained by alternately stacking a low acoustic impedance film and a high acoustic impedance film.

3. The elastic wave device according to claim 1, wherein the acoustic multilayer film is obtained by alternately and continuously stacking a low acoustic impedance film and a high acoustic impedance film in three or more layers and twenty or less layers.

4. The elastic wave device according to claim 2, wherein a thickness of at least three layers of the low acoustic impedance films and the high acoustic impedance films of the acoustic multilayer film is 0.016×wavelength to 0.11×wavelength of that of the bulk waves.

5. The elastic wave device according to claim 2, wherein the acoustic multilayer film has one or more layers of the low acoustic impedance film and two or more layers of the high acoustic impedance film, and a sum of the thickness of one layer of the low acoustic impedance film or an average thickness of any two layers of the low acoustic impedance films and an average thickness of any two layers of the high acoustic impedance films is 0.07 to 0.15×wavelengths of that of the bulk waves.

6. The elastic wave device according to claim 2, wherein at least one of the low acoustic impedance films and the high acoustic impedance films of the acoustic multilayer film are made of a film containing at least one of an Mg alloy, SiO$_2$, Al, Si, Ge, Ti, ZnO, Si$_x$N$_y$, SiO$_x$F$_y$ (where x and y are positive real numbers), AlN, SiC, Al$_2$O$_3$, Ag, Hf, TiO$_2$, Ni, Au, Ta, Mo, Pt, W, and Cu, or an oxide film, a nitride film, a carbon film, or an iodine film containing at least one of them.

7. The elastic wave device according to claim 1, wherein the piezoelectric substrate is made of single crystals of LiNbO$_3$, LiTaO$_3$, Li$_2$B$_4$O$_7$, or langasite.

8. The elastic wave device according to claim 1, wherein the piezoelectric substrate is made of LiNbO$_3$ crystals and has Euler angles of either (0°±5°, 66.5° to 82°, 0° to 180°) or (90°±5°, 90°±5°, 0° to 180°) or Euler angles crystallographically equivalent thereto; and the elastic wave device is configured to utilize thickness shear vibration of the piezoelectric substrate.

9. The elastic wave device according to claim 1, wherein the piezoelectric substrate is made of $LiNbO_3$ crystals and has Euler angles of (0°±5°, 119° to 133°, 0° to 180°) or Euler angles crystallographically equivalent thereto; and the elastic wave device is configured to utilize thickness longitudinal vibration of the piezoelectric substrate.

10. The elastic wave device according to claim 1, wherein the piezoelectric substrate is a strip-shaped piezoelectric substrate made of $LiNbO_3$ crystals and has Euler angles of (0°±5°, −123° to −80°, 0° to 180°) or Euler angles crystallographically equivalent thereto; and the elastic wave device is configured to utilize thickness shear vibration of the piezoelectric substrate.

11. The elastic wave device according to claim 1, wherein the piezoelectric substrate is made of $LiTaO_3$ crystals and has Euler angles of either (0°±5°, 56° to 96°, 0° to 180°) or (90°±5°, 90°±5°, 0° to 180°) or Euler angles crystallographically equivalent thereto; and the elastic wave device is configured to utilize the thickness shear vibration of the piezoelectric substrate.

12. The elastic wave device according to claim 1, wherein the piezoelectric substrate is made of $LiTaO_3$ crystals and has Euler angles of either (0°±5°, 112° to 138°, 0° to 180°) or Euler angles crystallographically equivalent thereto; and the elastic wave device is configured to utilize thickness longitudinal vibration of the piezoelectric substrate.

13. The elastic wave device according to claim 1, wherein the piezoelectric substrate is a strip-shaped piezoelectric substrate made of $LiTaO_3$ crystals, and has Euler angles of either (0°±5°, 63° to 91°, 0° to 180°) or (90°±5°, 90°±5°, 0° to 180°) or Euler angles crystallographically equivalent thereto; and the elastic wave device is configured to utilize thickness shear vibration of the piezoelectric substrate.

14. The elastic wave device according to claim 1, further comprising:

a holding substrate provided on a side of the acoustic multilayer film opposite to the piezoelectric substrate so that the acoustic multilayer film is sandwiched between the holding substrate and the piezoelectric substrate.

15. An elastic wave device comprising:

a piezoelectric substrate;

an electrode provided in contact with the piezoelectric substrate; and an acoustic multilayer film provided in contact with at least one of the piezoelectric substrate and the electrode; wherein the piezoelectric substrate is obtained by stacking two piezoelectric substrates such that:

one piezoelectric substrate has Euler angles of (φ, θ, ψ) on an upper surface and Euler angles of (φ, θ+180°, ψ) on a lower surface and the other piezoelectric substrate has Euler angles of (φ, θ+180°, ψ) on an upper surface and Euler angles of (φ, θ, ψ) on a lower surface;

one piezoelectric substrate has Euler angles of (φ, θ, ψ) on an upper surface and Euler angles of (φ, θ+180°, ψ) on a lower surface and the other piezoelectric substrate has Euler angles of (φ, θ+180°, ψ+180°) on an upper surface and Euler angles of (φ, θ, ψ+180°) on a lower surface; or one piezoelectric substrate has Euler angles of (φ, θ, ψ) on an upper surface and Euler angles of (φ, θ+180°, ψ) on a lower surface and the other piezoelectric substrate has Euler angles of (φ, θ, ψ+180°) on an upper surface and Euler angles of (φ, θ+180°, ψ+180°) on a lower surface; and the elastic wave device is configured to utilize one of a higher-order mode about three times a second harmonic of a thickness longitudinal vibration of the piezoelectric substrate or a higher-order mode about five times the second harmonic of the thickness longitudinal vibration of the piezoelectric substrate.

16. The elastic wave device according to claim 15, wherein the piezoelectric substrates are made of $LiNbO_3$ crystals having Euler angles of φ=−5° to 5°, θ=119° to 133°, ψ=0° to 180°, or Euler angles crystallographically equivalent thereto, or $LiTaO_3$ crystals having Euler angles of φ=−5° to 5°, θ=112° to 138°, ψ=0° to 180°, or Euler angles crystallographically equivalent thereto.

17. An elastic wave device comprising:

a piezoelectric substrate;

an electrode provided in contact with the piezoelectric substrate; and an acoustic multilayer film provided in contact with at least one of the piezoelectric substrate and the electrode; wherein the piezoelectric substrate is obtained by stacking two piezoelectric substrates such that:

one piezoelectric substrate has Euler angles of (φ, θ, ψ) on an upper surface and Euler angles of (φ, θ+180°, ψ) on a lower surface and the other piezoelectric substrate has Euler angles of (φ, θ+180°, ψ) on an upper surface and Euler angles of (φ, θ, ψ) on a lower surface;

one piezoelectric substrate has Euler angles of (φ, θ, ψ) on an upper surface and Euler angles of (φ, θ+180°, ψ) on a lower surface and the other piezoelectric substrate has Euler angles of (φ, θ+180°, ψ+180°) on an upper surface and Euler angles of (φ, θ, ψ+180°) on a lower surface; or one piezoelectric substrate has Euler angles of (φ, θ, ψ) on an upper surface and Euler angles of (φ, θ+180°, ψ) on a lower surface and the other piezoelectric substrate has Euler angles of (φ, θ, ψ+180°) on an upper surface and Euler angles of (φ, θ+180°, ψ+180°) on a lower surface; and the elastic wave device is configured to utilize one of a higher-order mode about three times a second harmonic of a thickness shear vibration of the piezoelectric substrate or a higher-order mode about five times the second harmonic of the thickness shear vibration of the piezoelectric substrate.

18. The elastic wave device according to claim 17, wherein the piezoelectric substrates are made of $LiNbO_3$ crystals having Euler angles of φ=−5° to 5°, θ=66.5° to 82°, ψ=0° to 180° or φ=85° to 95°, θ=85° to 95°, φ=0° to 180°, or Euler angles crystallographically equivalent thereto, or $LiTaO_3$ crystals having Euler angles of φ=−5° to 5°, θ=56° to 96°, ψ=0° to 180°, or φ=85° to 95°, θ=85° to 95°, ψ=0° to 180°, or Euler angles crystallographically equivalent thereto.

19. The elastic wave device according to claim 17, wherein the piezoelectric substrate is a strip-shaped piezoelectric substrate.

20. The elastic wave device according to claim 19, wherein the piezoelectric substrates are made of LiNbO$_3$ crystals having Euler angles of $\phi = -5°$ to $5°$, $\theta = -123°$ to $-80°$, $\psi = 0°$ to $180°$, or Euler angles crystallographically equivalent thereto, or LiTaO$_3$ crystals having Euler angles of $\phi = -5°$ to $5°$, $\theta = 63°$ to $91°$, $\psi = 0°$ to $180°$, or $\phi = 85°$ to $95°$, $\theta = 85°$ to $95°$, $\psi = 0°$ to $180°$, or Euler angles crystallographically equivalent thereto.

21. The elastic wave device according to claim 15, wherein the acoustic multilayer film is obtained by alternately stacking one or more layers of the low acoustic impedance film and two or more layers of the high acoustic impedance film, and a sum of the thickness of one layer of the low acoustic impedance film or an average thickness of any two layers of the low acoustic impedance films and an average thickness of any two layers of the high acoustic impedance films is 0.02 to 0.09× wavelength of that of the bulk waves.

* * * * *